United States Patent
Kim et al.

(10) Patent No.: US 12,520,584 B2
(45) Date of Patent: Jan. 6, 2026

(54) DISPLAY DEVICE

(71) Applicant: Samsung Display Co., LTD., Yongin-si (KR)

(72) Inventors: Dong Woo Kim, Yongin-si (KR); Min Kyu Woo, Yongin-si (KR); Kyung Bae Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 605 days.

(21) Appl. No.: 17/874,064

(22) Filed: Jul. 26, 2022

(65) Prior Publication Data

US 2023/0060203 A1 Mar. 2, 2023

(30) Foreign Application Priority Data

Aug. 26, 2021 (KR) .......................... 10-2021-0113434

(51) Int. Cl.
*H10D 86/40* (2025.01)
*H01L 25/16* (2023.01)
*H01L 23/00* (2006.01)

(52) U.S. Cl.
CPC ......... *H10D 86/441* (2025.01); *H01L 25/167* (2013.01); *H01L 24/24* (2013.01); *H01L 2224/24051* (2013.01); *H01L 2224/24147* (2013.01); *H01L 2224/245* (2013.01); *H01L 2924/0542* (2013.01); *H01L 2924/0549* (2013.01); *H01L 2924/12041* (2013.01)

(58) Field of Classification Search
CPC ............................ H10D 86/441; H01L 25/167
See application file for complete search history.

(56) References Cited

U.S. PATENT DOCUMENTS

| | | | |
|---|---|---|---|
| 7,701,132 B2 | 4/2010 | Oh | |
| 9,443,463 B2 | 9/2016 | Park et al. | |
| 2012/0001885 A1* | 1/2012 | Kang | H10K 59/1795 345/211 |
| 2014/0168553 A1* | 6/2014 | Park | G02F 1/136286 349/43 |
| 2022/0037447 A1 | 2/2022 | Cho et al. | |

FOREIGN PATENT DOCUMENTS

| | | |
|---|---|---|
| KR | 10-0700643 B1 | 3/2007 |
| KR | 10-1576834 B1 | 12/2015 |
| KR | 10-1864332 B1 | 7/2018 |
| KR | 10-2055152 B1 | 12/2019 |
| KR | 10-2020-0031194 A | 3/2020 |

* cited by examiner

*Primary Examiner* — Peter M Albrecht
(74) *Attorney, Agent, or Firm* — Womble Bond Dickinson (US) LLP

(57) ABSTRACT

A display device includes: a power source line; a plurality of gate lines each extending in a first direction and arranged along a second direction in a plan view; a plurality of pixels connected to the power source line and the gate lines; and a plurality of vertical lines each extending in the second direction and arranged along the first direction in the plan view, wherein the vertical lines include a plurality of gate connection lines and a plurality of dummy lines between the gate connection lines, wherein the gate connection lines connect the gate lines to a gate driver, wherein the dummy lines are connected to the power source line, and wherein a distance between the dummy lines spaced apart from each other with at least one of the gate connection lines interposed therebetween is constant throughout.

20 Claims, 12 Drawing Sheets

DISPLAY DEVICE

CROSS-REFERENCE TO RELATED APPLICATION

The present application claims priority to and the benefit of Korean Patent Application No. 10-2021-0113434, filed Aug. 26, 2021, the entire of which is incorporated herein by reference.

BACKGROUND

1. Field

Aspects of some embodiments of the present invention relate to a display device.

2. Discussion

In recent years, as interest in information display increases, research and development on display devices are continuously being made.

The above information disclosed in this Background section is only for enhancement of understanding of the background and therefore the information discussed in this Background section does not necessarily constitute prior art.

SUMMARY

Recently, as the display device becomes larger, a voltage drop may occur in a power source supplied to pixels in the display device. Due to the voltage drop, a deviation in luminance may occur depending on positions in the display device.

According to some embodiments of the present invention a display device may be capable of reducing the deviation in luminance due to the voltage drop.

According to some embodiments of the present invention, a display device includes: a power source line; gate lines each extending in a first direction and arranged along a second direction on a plane; pixels connected to the power source line and the gate lines; and vertical lines each extending in the second direction and arranged along the first direction on a plane. The vertical lines may include gate connection lines and dummy lines between the gate connection lines, the gate connection lines may connect the gate lines to a gate driver, the dummy lines may be connected to the power source line, and a distance between the dummy lines spaced apart from each other with at least one of the gate connection lines interposed therebetween may be constant throughout.

According to some embodiments, the power source line may include a first power source line to which a first power source voltage is applied, and a second power source line to which a second power source voltage lower than the first power voltage is applied, and each of the pixels may include at least one light emitting element electrically connected between the first power source line and the second power source line.

According to some embodiments, the dummy lines may be electrically connected to the first power source line.

According to some embodiments, the dummy lines may be electrically connected to the second power source line.

According to some embodiments, the vertical lines may be arranged along the first direction to be spaced apart from each other by a distance corresponding to one of the pixels.

According to some embodiments, at least one gate connection line among the gate connection lines and at least one dummy line among the dummy lines may form a line group, and the line group may be repeatedly arranged along the first direction.

According to some embodiments, the line group may include at least two dummy lines among the dummy lines.

According to some embodiments, the power source line may include horizontal power source lines extending in the first direction and spaced apart from each other along the second direction, the dummy lines may be connected to the horizontal power source lines, and the dummy lines and the horizontal power source lines may form a mesh structure on a plane.

According to some embodiments, the gate connection lines and the dummy lines may be on a same layer and include a same material.

According to some embodiments, the dummy lines may be spaced apart from the horizontal power source lines with at least one insulating layer interposed therebetween, and the horizontal power source lines may be connected to the dummy lines through contact holes penetrating the at least one insulating layer.

According to some embodiments, the horizontal power source lines and the gate lines may be on a same layer and include a same material.

According to some embodiments, each of the pixels may include a transistor on a substrate and at least one light emitting element connected to the transistor, and the dummy lines may be between the substrate and the transistor.

According to some embodiments, the horizontal power source lines may be on a same layer as one of a gate electrode, a source electrode, and a drain electrode of the transistor.

According to some embodiments, the display device may further include data lines each extending in the second direction and arranged in the first direction on a plane, and connected to the pixels; the gate driver connected to the gate lines; and a data driver connected to the data lines, and the gate driver and the data driver may be positioned in a same direction based on the pixels on a plane.

According to some embodiments of the present invention, a display device includes: pixels in a display area; a power source line in the display area and connected to the pixels; gate lines each extending in a first direction and arranged along a second direction on a plane, and connected to the pixels; gate connection lines each extending in the second direction and arranged along the first direction on a plane, and connected to the gate lines; and dummy lines on a same layer as the gate connection lines, each extending in the second direction on a plane, and connected to the power source line within the display area. At least one gate connection line among the gate connection lines and at least one dummy line among the dummy lines may form a line group, and the line group may be repeatedly arranged along the second direction over an entire display area.

According to some embodiments, a distance between the dummy lines spaced apart from each other with the at least one gate connection line among the gate connection lines interposed therebetween may be constant over the entire display area.

According to some embodiments, the power source line may include a first power source line to which a first power source voltage is applied and a second power source line to which a second power source voltage lower than the first power voltage is applied, and each of the pixels may include at least one light emitting element electrically connected between the first power source line and the second power source line.

According to some embodiments, at least some of the dummy lines may be electrically connected to the first power source line.

According to some embodiments, at least some of the dummy lines may be electrically connected to the second power source line.

According to some embodiments, the power source line may include horizontal power source lines extending in the first direction and spaced apart from each other along the second direction, the dummy lines may be connected to the horizontal power source lines, and the dummy lines and the horizontal power source lines may form a mesh structure on a plane.

BRIEF DESCRIPTION OF THE DRAWINGS

The accompanying drawings, which are included to provide a further understanding of the inventive concepts, and are incorporated in and constitute a part of this specification, illustrate aspects of some embodiments of the inventive concepts, and, together with the description, serve to explain principles of the inventive concepts.

DETAILED DESCRIPTION

Figure 1:
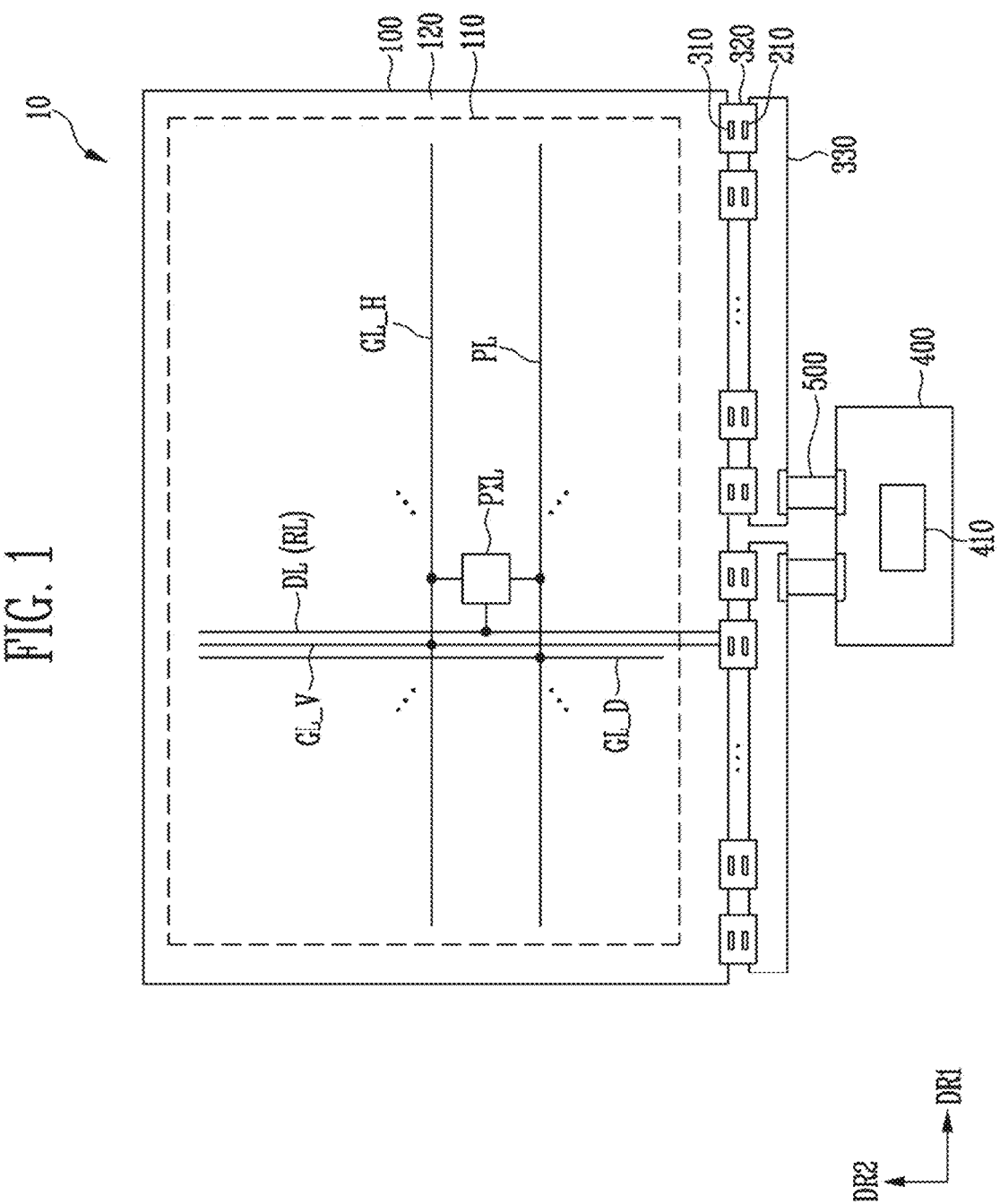
FIG. 1 is a diagram schematically illustrating a display device according to some embodiments of the present invention.

As the present invention allows for various changes and numerous embodiments, aspects of some embodiments will be illustrated and described in the drawings and described in more detail in the written description. However, this is not intended to limit embodiments according to the present invention to particular modes of practice, and it is to be appreciated that all changes, equivalents, and substitutes that do not depart from the spirit and technical scope of embodiments according to the present invention are encompassed in the present invention.

In describing the drawings, similar reference numerals are used for similar elements. In the accompanying drawings, the sizes of elements may be shown to be enlarged than the actual for clarity of the present invention. It will be understood that, although the terms "first", "second", etc. may be used herein to describe various elements, these elements should not be limited by these terms. These terms are only used to distinguish one element from another element. For instance, a first element discussed below could be termed a second element without departing from the scope of the present invention. Similarly, the second element could also be termed the first element. In the disclosure, the singular forms are intended to include the plural forms, unless the context clearly indicates otherwise.

It will be further understood that the terms "comprise", "include", "have", etc. used in the disclosure, specify the presence of stated features, integers, steps, operations, elements, components, and/or combinations of them but do not preclude the presence or addition of one or more other features, integers, steps, operations, elements, components, and/or combinations thereof. Furthermore, when a first part is "connected" to a second part, this may include the case where the first part is directly connected to the second part as well as the case where a third part is connected between them.

Hereinafter, aspects of some embodiments of the present invention and other matters to enable a person skilled in the art to understand the characteristics of embodiments according to the present invention will be described in more detail with reference to the accompanying drawings. In the description below, the singular expression may also include the plural expression unless the context clearly includes only the singular.

FIG. 1 is a diagram schematically illustrating a display device according to some embodiments of the present invention. As illustrated in FIG. 1, according to some embodiments, a display device 10 having a plurality of gate drive integrated circuits (hereinafter, an integrated circuit is referred to as an "IC") and data drive ICs is shown. However, embodiments according to the present invention are not limited thereto. For example, the present invention can also be applied to a display device including one gate drive IC and one data drive IC.

Referring to FIG. 1, the display device 10 may include a display panel 100 (a display unit or a pixel unit), a gate drive IC 210 (a gate driver or a scan driver), a data drive IC 310 (a data driver or a source driver), and a timing controller 410.

The display panel 100 may include a display area 110 for displaying an image and a non-display area 120 outside the display area 110. The display panel 100 may include a horizontal gate line GL_H (or a gate line), a data line DL (and a readout line RL), a power source line PL, and a pixel PXL.

The horizontal gate line GL_H may extend in a first direction DR1 and may be arranged along a second direction DR2. The data line DL (and the readout line RL) may extend in the second direction DR2 and may be arranged along the first direction DR1. The power source line PL may extend in the first direction DR1 and may be arranged along the second direction DR2. However, embodiments according to the present invention are not limited thereto. For example, as will be described in more detail later with reference to FIG. 5, the power source line PL may also extend in the second direction DR2 and may have a mesh structure over the entire display panel 100.

The pixel PXL may be positioned in an area where the horizontal gate line GL_H and the data line DL intersect, or may be positioned in an area partitioned or defined by the horizontal gate line GL_H and the data line DL. The pixel PXL may be connected to the horizontal gate line GL_H, the data line DL, and the power source line PL, and may emit light with a luminance corresponding to a data signal (or data voltage) in response to a gate signal. The gate signal may be provided through the horizontal gate line GL_H, and the data signal may be provided through the data line DL. To this end, the pixel PXL may include at least one light emitting element, a switching transistor that transmits the data signal in response to the gate signal, a storage capacitor for storing the data signal transmitted through the switching transistor, and a driving transistor for providing a driving current from the power source line PL to at least one light emitting element in response to the stored data signal. Here, the light emitting element may be composed of an organic light emitting diode or an inorganic light emitting diode, and the inorganic light emitting diode may include a micro light emitting diode, a quantum dot light emitting diode, or the like. In addition, the light emitting element may be composed of an organic material and an inorganic material in combination. When the pixel PXL includes a plurality of light emitting elements, the plurality of light emitting elements may be connected to each other in series, in parallel, or in series and parallel.

According to some embodiments, the display panel 100 may further include a vertical gate line GL_V (or a gate connection line) and a dummy line GL_D. As will be described in more detail later, the vertical gate line GL_V and the dummy line GL_D may include the same material and may be formed on the same layer through the same process. The vertical gate line GL_V and the dummy line GL_D may be included in vertical lines (for example, vertical lines formed by one process).

The vertical gate line GL_V and the dummy line GL_D may extend in the second direction DR2 and may be arranged along the first direction DR1. The vertical gate line GL_V may be connected to the horizontal gate line GL_H (or the corresponding horizontal gate line GL_H), and may transmit the gate signal from the gate drive IC 210 to the horizontal gate line GL_H. The dummy line GL_D may be connected to the power source line PL, and may reduce resistance of the power source line PL (or IR drop due to the resistance, or a voltage drop).

For reference, the vertical gate line GL_V may be provided to connect the gate drive IC 210 to the horizontal gate line GL_H, and the dummy line GL_D may be further provided to ensure uniformity in units of pixels (for example, a line corresponding to the vertical gate line GL_V may be provided for each pixel column so that the characteristics between pixels PXL are uniform). By connecting the dummy line GL_D (that is, the dummy line GL_D not used for connection between the gate drive IC 210 and the horizontal gate line GL_H) to the power source line PL, the voltage drop in the power source line PL and a deterioration in luminance of the pixel PXL due to the voltage drop may be reduced or alleviated.

According to some embodiments, at least one vertical gate line GL_V and at least one dummy line GL_D may be alternately and repeatedly arranged along the first direction DR1. For example, three or five vertical gate lines GL_V and one dummy line GL_D may be alternately and repeatedly arranged along the first direction DR1. For example, three or five vertical gate lines GL_V and two dummy lines GL_D may be alternately and repeatedly arranged along the first direction DR1. That is, each of the vertical gate line GL_V and the dummy line GL_D may be evenly distributed over the entire display panel 100 with each other interposed therebetween. The dummy line GL_D may be evenly distributed over the entire display panel 100 (or the display area 110) so that the voltage drop in the power source line PL is evenly compensated over the entire display panel 100.

The timing controller 410 may control the gate drive IC 210 and the data drive IC 310. The timing controller 410 may receive a control signal from outside and generate a gate control signal and a data control signal based on the control signal. The control signal may include a vertical synchronization signal, a horizontal synchronization signal, an external clock signal, and the like. The timing controller 410 may provide the gate control signal to the gate drive IC 210 and provide the data control signal to the data drive IC 310.

Also, the timing controller 410 may generate image data by rearranging input data (or raw image data) provided from the outside (for example, a graphics processor), and provide the image data to the data drive IC 310. The timing controller 410 may be mounted on a control board 400.

The gate drive IC 210 and the data drive IC 310 may drive the display panel 100. The gate drive IC 210 and the data drive IC 310 may be positioned on one side (for example, a direction opposite to the second direction DR2) of the display panel 100 (or the display area 110).

The gate drive IC 210 may receive the gate control signal from the timing controller 410 and generate gate signals based on the gate control signal. The gate drive IC 210 may provide the gate signals to the display panel 100. The gate control signal may include a start pulse and a clock signal (for example, a scan clock signal and a carry clock signal). The gate drive IC 210 may generate a gate signal corresponding to the start pulse using the clock signal and provide the gate signal to the vertical gate line GL_V. For example, the gate drive IC 210 may be implemented as a shift register that sequentially shifts and outputs the start pulse.

The gate drive IC 210 may be mounted on a drive circuit film 320 (or a flexible circuit board), and connected to the timing controller 410 mounted on the control board 400 via a printed circuit board 330 and/or a cable 500 (or a flexible circuit board). However, embodiments according to the present invention are not limited thereto.

The data drive IC 310 may receive the data control signal and the image data from the timing controller 410 and generate a data signal corresponding to the image data. The data drive IC 310 may provide the data signal to the display panel 100. The data drive IC 310 may be mounted on the drive circuit film 320 and connected to the timing controller 410 via the printed circuit board 330 and/or the cable 500.

The cable 500 may electrically connect the control board 400 and the printed circuit board 330 through upper and lower connectors. Here, the cable 500 may collectively mean a device having lines capable of electrically connecting the control board 400 and the printed circuit board 330, and the like. For example, the cable 500 may be implemented as a flexible circuit board.

As described above, the display device 10 may include the gate drive IC 210 and the data drive IC 310 located on one side of the display panel 100 (or the display area 110). Because the gate drive IC 210 and the data drive IC 310 are located only on one side of the display panel 100 (or the display area 110), the non-display area 120 at the remaining sides of the display device 10 may be minimized or reduced.

In addition, the display device 10 may include the vertical gate line GL_V connecting the gate drive IC 210 to the horizontal gate line GL_H, and the dummy line GL_D corresponding to the vertical gate line GL_V (that is, the dummy line GL_D included in the vertical lines but not used for connection between the gate drive IC 210 and the horizontal gate line GL_H). The dummy line GL_D may be connected to the power source line PL and uniformly (or evenly) arranged over the entire display panel 100 (or the display area 110). Accordingly, the voltage drop in the power source line PL may be alleviated evenly over the entire display panel 100, and the luminance of the display panel 100 may be improved as a whole in the display area 110.

Figure 2:
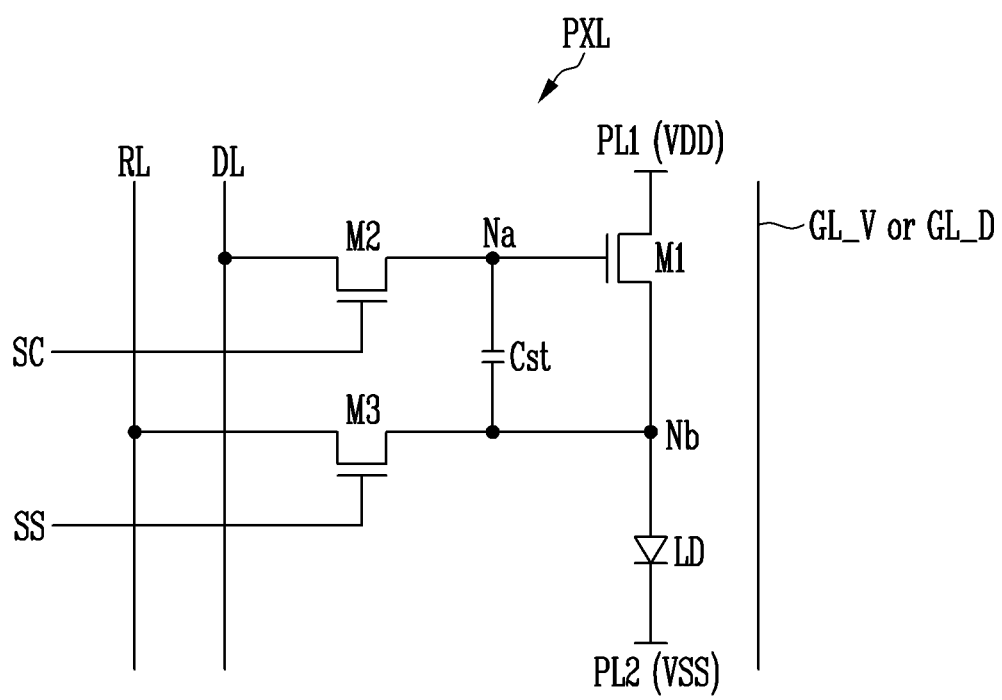
FIG. 2 is a diagram illustrating further aspect of a pixel included in the display device of FIG. 1 according to some embodiments.

FIG. 2 is a diagram illustrating further aspects of a pixel included in the display device of FIG. 1 according to some embodiments.

Referring to FIGS. 1 and 2, the pixel PXL may include first to third transistors M1, M2, and M3, a storage capacitor Cst, and a light emitting element LD. The first to third transistors M1, M2, and M3 may be N-type transistors, but are not limited thereto. For example, at least one of the first to third transistors M1, M2, or M3 may be a P-type transistor.

A gate electrode of the first transistor M1 may be connected to a gate node Na, and one electrode (or a first electrode) of the first transistor M1 may be connected to a first power source line PL1 (or a first power source VDD), and the other electrode (or a second electrode) of the first transistor M1 may be connected to a source node Nb. The first transistor M1 may be referred to as a driving transistor. The first power source line PL1 may be included in the power source line PL described with reference to FIG. 1.

A gate electrode of the second transistor M2 may be connected to a scan line SC (or a first gate line), one electrode of the second transistor M2 may be connected to a data line DL, and the other electrode of the second transistor M2 may be connected to the gate node Na. The second transistor M2 may be referred to as a switching transistor, a scan transistor, or the like. The scan line SC may be included in the horizontal gate line GL_H described with reference to FIG. 1 or may be the horizontal gate line GL_H.

A gate electrode of the third transistor M3 may be connected to a sensing scan line SS (or a second gate line), and one electrode of the third transistor M3 may be connected to a readout line RL, and the other electrode of the third transistor M3 may be connected to the source node Nb. The third transistor M3 may be referred to as an initialization transistor, a sensing transistor, or the like. The sensing scan line SS may be included in the horizontal gate line GL_H described with reference to FIG. 1 or may be the horizontal gate line GL_H. The readout line RL may be arranged in pairs with the data line DL. According to some embodiments, the readout line RL and the third transistor M3 may be omitted.

One electrode of the storage capacitor Cst may be connected to the gate node Na, and the other electrode of the storage capacitor Cst may be connected to the source node Nb.

The light emitting element LD may have an anode connected to the source node Nb and a cathode connected to a second power source line PL2 (or a second power source VSS). The light emitting element LD may be a light emitting diode having an ultra-small size (for example, a size as small as a nano-scale to a micro-scale) using a material having an inorganic crystal structure. The light emitting element LD may be a micro light emitting diode manufactured by an etching method or a micro light emitting diode manufactured by a growth method. However, the light emitting element LD is not limited thereto, and the light emitting element LD may be an organic light emitting diode.

The second power source line PL2 may be included in the power source line PL described with reference to FIG. 1.

The first power source VDD (or a first power source voltage) may be provided to the first power source line PL1, and the second power source VSS (or a second power source voltage) may be provided to the second power source line PL2. The first and second power sources VDD and VSS may have voltage levels necessary for the operation of the pixel PXL. For example, the first power source VDD may have a voltage level higher than that of the second power source VSS.

A scan signal having a turn-on voltage level (for example, a logic high level) may be applied to the scan line SC, and a sensing scan signal having a turn-on voltage level may be applied to the sensing scan line SS. Also, a data signal corresponding to a grayscale value (e.g., a set or predetermined grayscale value) may be applied to the data line DL.

In this case, the second transistor M2 may be turned on in response to the scan signal, and the data signal may be provided to one electrode of the storage capacitor Cst. In addition, the third transistor M3 may be turned on in response to the sensing scan signal SS, and a first reference voltage applied to the readout line RL may be provided to the other electrode of the storage capacitor Cst. Accordingly, a voltage corresponding to a difference between the data signal and the first reference voltage may be stored in the storage capacitor Cst. Thereafter, when the second transistor M2 and the third transistor M3 are turned off, the amount of driving current flowing through the first transistor M1 from the first power source line PL1 may be determined in response to the voltage stored in the storage capacitor Cst, and the light emitting element LD may emit light with a luminance corresponding to the amount of driving current.

Meanwhile, the scan signal and the sensing scan signal for writing data into the pixel PXL and emitting light may have the same waveform. Therefore, according to some embodiments, the scan signal applied to the scan line SC may also be applied to the sensing scan line SS as the sensing scan signal. That is, the scan line SC and the sensing scan line SS may be implemented as one horizontal gate line GL_H.

In some embodiments, a vertical gate line GL_V or a dummy line GL_D may be located on one side of the pixel PXL. For example, the vertical gate line GL_V or the dummy line GL_D may be located between the pixel PXL and an adjacent pixel. The vertical gate line GL_V may be connected to the scan line SC and/or the sensing scan line SS, and the dummy line GL_D may be connected to the first power source line PL1 or the second power source line PL2.

The vertical gate line GL_V may be arranged to be connected to the horizontal gate line GL_H. In addition, for uniformity of the pixels PXL (that is, in order for the parasitic capacitance generated by the vertical gate line GL_V to be uniformly formed in all pixels PXL so that the characteristics of the pixels PXL are uniform), the dummy line GL_D may be located in some pixels PXL (for example, pixels PXL that is not adjacent to the vertical gate line GL_V).

Figure 3:
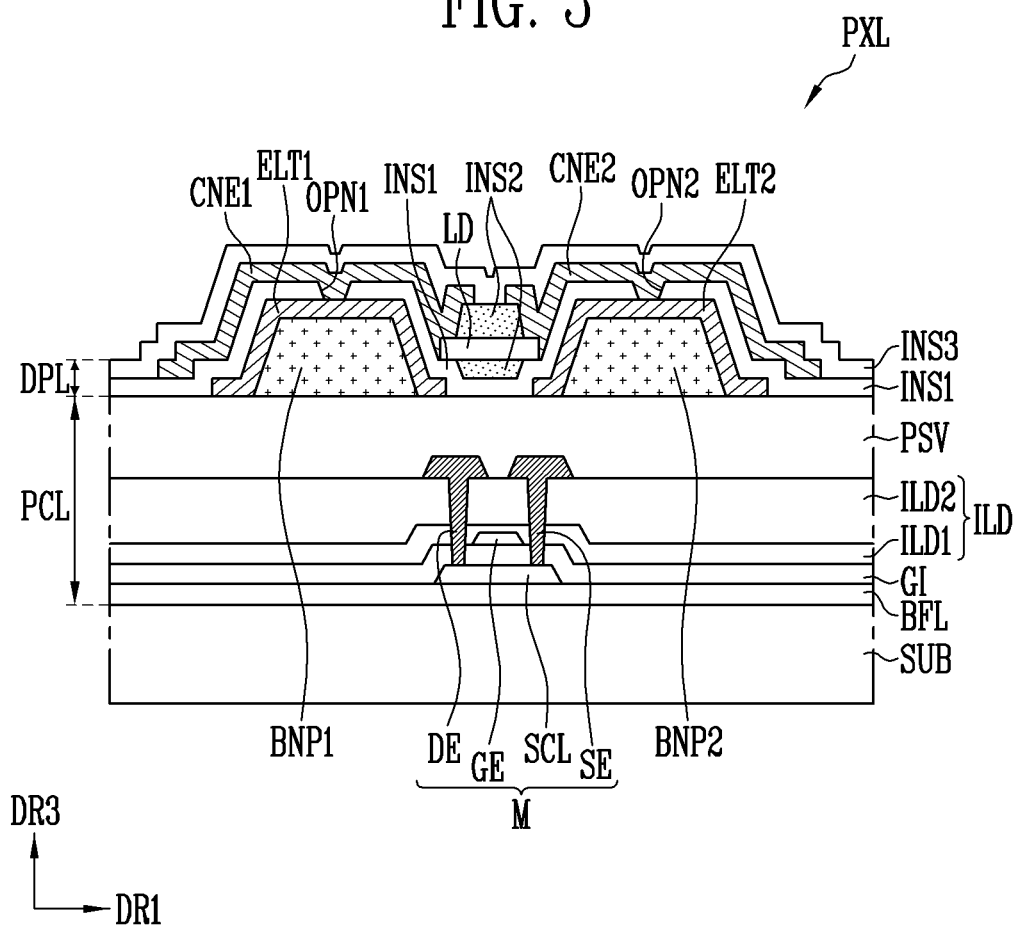
FIG. 3 is a cross-sectional view illustrating further aspects of the pixel of FIG. 2 according to some embodiments.

FIG. 3 is a cross-sectional view illustrating further aspects of the pixel of FIG. 2 according to some embodiments.

Referring to FIGS. 1 to 3, the pixel PXL may include a pixel circuit layer PCL and a display element layer DPL located on a substrate SUB.

The substrate SUB may be made of an insulating material such as glass or resin. Also, the substrate SUB may be made of a material having flexibility to be bent or folded, and may have a single-layer structure or a multi-layer structure.

For convenience, the pixel circuit layer PCL will be described first, and then the display element layer DPL will be described.

The pixel circuit layer PCL may include a buffer layer BFL, a transistor M, and a passivation layer PSV. Here, the transistor M may be one of the first, second, and third transistors M1, M2, and M3 described with reference to FIG. 2.

The buffer layer BFL may be provided and/or formed on the substrate SUB, and may prevent or reduce instances of impurities diffusing into the transistor M. The buffer layer BFL may be an inorganic insulating layer including an inorganic material. The buffer layer BFL may include at least one of silicon nitride (SiNx), silicon oxide (SiOx), silicon oxynitride (SiOxNy), or a metal oxide such as aluminum oxide (AlOx). The buffer layer BFL may be provided as a single layer, but may also be provided as a multilayer of at least a double layer. When the buffer layer BFL is provided as a multilayer, each layer may be formed of the same material as each other or may be formed of different materials. The buffer layer BFL may be omitted depending on the material of the substrate SUB, process conditions, and the like.

The transistor M may include a semiconductor pattern SCL, a gate electrode GE, one electrode SE, and the other electrode DE. The one electrode SE may be any one of a source electrode and a drain electrode, and the other electrode DE may be the other electrode. For example, when the one electrode SE is the source electrode, the other electrode DE may be the drain electrode.

The semiconductor pattern SCL may be provided and/or formed on the buffer layer BFL. The semiconductor pattern SCL may include a first contact region in contact with the one electrode SE and a second contact region in contact with the other electrode DE. A region between the first contact region and the second contact region may be a channel region. This channel region may overlap the gate electrode GE of the corresponding transistor M. The semiconductor pattern SCL may be a semiconductor pattern made of amorphous silicon, polysilicon, low-temperature polysilicon, oxide semiconductor, organic semiconductor, or the like. The channel region may be, for example, a semiconductor pattern that is not doped with impurities, and may be an intrinsic semiconductor. The first contact region and the second contact region may be semiconductor patterns doped with impurities.

The gate electrode GE may be provided and/or formed on a gate insulating layer GI to correspond to the channel region of the semiconductor pattern SCL. The gate electrode GE may be provided on the gate insulating layer GI to overlap the channel region of the semiconductor pattern SCL. The gate electrode GE may be one selected from the group consisting of copper (Cu), molybdenum (Mo), tungsten (W), aluminum neodymium (AlNd), titanium (Ti), aluminum (Al), silver (Ag), and alloys thereof, or a mixture thereof, and may be formed of a single layer. Alternatively, the gate electrode GE may be formed of a double-layer or multi-layer structure of low-resistance materials such as molybdenum (Mo), titanium (Ti), copper (Cu), aluminum (Al), or silver (Ag) in order to reduce line resistance.

The gate insulating layer GI may be an inorganic insulating layer including an inorganic material. For example, the gate insulating layer GI may include at least one of silicon nitride (SiNx), silicon oxide (SiOx), silicon oxynitride (SiOxNy), or a metal oxide such as aluminum oxide (AlOx). However, the material of the gate insulating layer GI is not limited to the above-described embodiments, and according to some embodiments, various materials capable of adding insulation to the gate insulating layer GI may be applied. For example, the gate insulating layer GI may be formed of an organic insulating layer including an organic material. The gate insulating layer GI may be provided as a single layer, or may be provided as a multilayer of at least a double layer.

Each of the one electrode SE and the other electrode DE may be provided and/or formed on an interlayer insulating layer ILD, and may be in contact with the first contact region and the second contact region of the semiconductor pattern SCL through contact holes sequentially penetrating the gate insulating layer GI and the interlayer insulating layer ILD. For example, the one electrode SE may contact the first contact region of the semiconductor pattern SCL, and the other electrode DE may contact the second contact region of the semiconductor pattern SCL. Each of the electrodes SE and DE may include the same material as that of the gate electrode GE, or may include one or more materials selected from materials presented as the materials constituting the gate electrode GE.

The interlayer insulating layer ILD may include a first interlayer insulating layer ILD1 and a second interlayer insulating layer ILD2.

The first interlayer insulating layer ILD1 may include the same material as that of the gate insulating layer GI, or may include one or more materials selected from materials presented as the materials constituting the gate insulating layer GI.

The second interlayer insulating layer ILD2 may be provided and/or formed on the first interlayer insulating layer ILD1. The second interlayer insulating layer ILD2 may be an inorganic insulating layer including an inorganic material or an organic insulating layer including an organic material. According to some embodiments, the second interlayer insulating layer ILD2 may include the same material as the first interlayer insulating layer ILD1, but embodiments according to the present invention are not limited thereto. The second interlayer insulating layer ILD2 may be provided as a single layer, or may be provided as a multilayer of at least a double layer. According to some embodiments, the second interlayer insulating layer ILD2 may be omitted.

In the above-described embodiments, although the electrodes SE and DE of the transistor M have been described as separate electrodes electrically connected to the semiconductor pattern SCL through the contact holes sequentially penetrating the gate insulating layer GI and the interlayer insulating layer ILD, embodiments according to the present invention are not limited thereto. According to some embodiments, the one electrode SE of the transistor M may be the first contact region adjacent to the channel region of the semiconductor pattern SCL, and the other electrode DE of the transistor M may be the second contact region adjacent to the channel region of the semiconductor pattern SCL. In this case, the other electrode DE of the transistor M may be electrically connected to the light emitting element LD of the pixel PXL through a separate connection means such as a bridge electrode or the like.

The transistor M may be composed of a low temperature polysilicon thin film transistor (LTPS TFT), but embodiments according to the present invention are not limited thereto. According to some embodiments, the transistor M may be composed of an oxide semiconductor thin film transistor. In addition, in the above-described embodiments, the case where the transistor M is a thin film transistor having a top gate structure has been described as an example, but embodiments according to the present invention are not limited thereto, and the structure of the transistor M may be variously changed. For example, the transistor M may be a thin film transistor having a bottom gate structure.

The pixel circuit layer PCL may further include the storage capacitor Cst (refer to FIG. 2) for storing a voltage applied between the gate electrode and the one electrode SE (or the source electrode) of the transistor M, and the power source line PL (refer to FIG. 1) (or the first and second power source lines PL1 and PL2, refer to FIG. 2) for providing a power source voltage to the transistor M (or the pixel PXL).

The passivation layer PSV may be provided and/or formed on the transistor M.

The passivation layer PSV may be provided in a form including an organic insulating layer, an inorganic insulating layer, or an organic insulating layer arranged on the inorganic insulating layer. The inorganic insulating layer may include, for example, at least one of silicon oxide (SiOx), silicon nitride (SiNx), silicon oxynitride (SiOxNy), or a metal oxide such as aluminum oxide (AlOx). The organic insulating layer may include, for example, at least one of acrylic resin (polyacrylates resin), epoxy resin, phenolic resin, polyamides resin, polyimide resin, unsaturated polyesters resin, poly-phenylen ethers resin, poly-phenylene sulfides resin, or benzocyclobutene resin.

The display element layer DPL may be provided on the passivation layer PSV.

The display element layer DPL may include first and second bank patterns BNP1 and BNP2, first and second pixel electrodes ELT1 and ELT2, a light emitting element LD, and first and second contact electrodes CNE1 and CNE2. Also, the display element layer DPL may include first to third insulating layers INS1 to INS3.

The first and second bank patterns BNP1 and BNP2 may be arranged to be spaced apart from each other. The first and second bank patterns BNP1 and BNP2 may be support members supporting each of the first and second pixel electrodes ELT1 and ELT2 to change the surface profile (or shape) of each of the first and second pixel electrodes ELT1 and ELT2 in a third direction DR3 so that light emitted from light emitting elements LD is guided in an image display direction (for example, a front direction) of the display device. That is, the first and second bank patterns BNP1 and BNP2 may change the surface profile (or shape) of each of the first and second pixel electrodes ELT1 and ELT2 in the third direction DR3.

The first and second bank patterns BNP1 and BNP2 may be provided and/or formed between the passivation layer PSV and a corresponding electrode. For example, the first bank pattern BNK1 may be provided and/or formed between the passivation layer PSV and the first pixel electrode ELT1, and the second bank pattern BNK2 may be provided and/or formed between the passivation layer PSV and the second pixel electrode ELT2.

The first and second bank patterns BNP1 and BNP2 may be an inorganic insulating layer including an inorganic material or an organic insulating layer including an organic material. In some embodiments, the first and second bank patterns BNP1 and BNP2 may include a single organic insulating layer and/or a single inorganic insulating layer, but embodiments according to the present invention are not limited thereto. According to some embodiments, the first and second bank patterns BNP1 and BNP2 may be provided in the form of multiple layers in which at least one organic insulating layer and at least one inorganic insulating layer are stacked. However, materials of the first and second bank patterns BNP1 and BNP2 are not limited to the above-described embodiments, and according to some embodiments, the first bank pattern BNK1 may include a conductive material.

The first and second bank patterns BNP1 and BNP2 may have a cross section of a trapezoidal shape whose width becomes narrower toward an upper portion in the third direction DR3 from one surface (for example, an upper surface) of the passivation layer PSV. However, embodiments according to the present invention are not limited thereto. According to some embodiments, the first and second bank patterns BNP1 and BNP2 may include a curved surface having a cross section of a semi-elliptical shape or a semi-circular shape (or a hemispherical shape) whose width becomes narrower toward an upper portion in the third direction DR3 from one surface of the passivation layer PSV. When viewed in cross section, the shapes of the first and second bank patterns BNP1 and BNP2 are not limited to the above-described embodiments, and may be variously changed within a range capable of improving the efficiency of light emitted from each of the light emitting elements LD. The first and second bank patterns BNP1 and BNP2 adjacent in the first direction DR1 may be located on the same surface of the passivation layer PSV, and may have the same height (or thickness) in the third direction DR3.

In the above-described embodiments, the case where the first and second bank patterns BNP1 and BNP2 are provided and/or formed on the passivation layer PSV and the first and second bank patterns BNP1 and BNP2 and the passivation layer PSV are formed by different processes has been described, but embodiments according to the present invention are not limited thereto. According to some embodiments, the first and second bank patterns BNP1 and BNP2 and the passivation layer PSV may be formed through the same process. In this case, the first and second bank patterns BNP1 and BNP2 may be one area of the passivation layer PSV.

The first and second pixel electrodes ELT1 and ELT2 may be provided and/or formed on the corresponding first and second bank patterns BNP1 and BNP2.

Each of the first and second pixel electrodes ELT1 and ELT2 may be formed of a material having a constant reflectance so that the light emitted from the light emitting element LD travels in the image display direction of the display device. Each of the first and second pixel electrodes ELT1 and ELT2 may be formed of a conductive material having a constant reflectance. The conductive material may include an opaque metal to reflect (e.g., advantageously or desirably reflect) the light emitted from the light emitting element LD in the image display direction of the display device. The opaque metal may include, for example, a metal such as silver (Ag), magnesium (Mg), aluminum (Al), platinum (Pt), palladium (Pd), gold (Au), nickel (Ni), neodymium (Nd), iridium (Ir), chromium (Cr), titanium (Ti), and alloys thereof. According to some embodiments, each of the first and second pixel electrodes ELT1 and ELT2 may include a transparent conductive material. The transparent conductive material may include a conductive oxide such as indium tin oxide (ITO), indium zinc oxide (IZO), zinc oxide (ZnOx), indium gallium zinc oxide (IGZO), and indium tin zinc oxide (ITZO), or a conductive polymer such as poly (3,4-ethylenedioxythiophene) (PEDOT). The zinc oxide (ZnOx) may be zinc oxide (ZnO) and/or zinc peroxide (ZnO$_2$).

When each of the first and second pixel electrodes ELT1 and ELT2 includes the transparent conductive material, a separate conductive layer made of an opaque metal for reflecting the light emitted from the light emitting element LD in the image display direction of the display device may be added. However, the material of each of the first and second pixel electrodes ELT1 and ELT2 is not limited to the above-described materials.

Each of the first and second pixel electrodes ELT1 and ELT2 may be provided and/or formed as a single layer, but embodiments according to the present invention are not limited thereto. According to some embodiments, each of the first and second pixel electrodes ELT1 and ELT2 may be provided and/or formed as a multilayer in which at least two or more of metals, alloys, conductive oxides, and conductive polymers are stacked. Each of the first and second pixel electrodes ELT1 and ELT2 may be formed of at least a double layer or more so as to minimize distortion due to signal delay when transmitting a signal (or voltage) to both ends of each of the light emitting elements LD. For example, each of the first and second pixel electrodes ELT1 and ELT2 may be formed as a multilayer sequentially stacked in the order of indium tin oxide (ITO)/silver (Ag)/indium tin oxide (ITO).

According to some embodiments, the first pixel electrode ELT1 may be electrically connected to the transistor M through a first contact hole penetrating the passivation layer PSV, and the second pixel electrode ELT2 may be electrically connected to the power source line (for example, the second power source line PL2, refer to FIG. 2) of the pixel circuit layer PCL through a second contact hole penetrating the passivation layer PSV.

Each of the first pixel electrode ELT1 and the second pixel electrode ELT2 may be used as an alignment electrode (or alignment line) that receives an alignment signal (e.g., a set or predetermined alignment signal) (or alignment voltage) from a corresponding component of the pixel circuit layer PCL to align the light emitting elements LD. For example, the first pixel electrode ELT1 may be used as a first alignment electrode (or a first alignment line) that receives a first alignment signal (or a first alignment voltage) from some components of the pixel circuit layer PCL, and the second pixel electrode ELT2 may be used as a second alignment electrode (or a second alignment line) that receives a second alignment signal (or a second alignment voltage) from another component of the pixel circuit layer PCL.

After the light emitting elements LD are aligned in the pixel PXL, a portion of the first pixel electrode ELT1 positioned between adjacent pixels PXL may be removed in order to individually (or independently) drive the pixel PXL.

After the light emitting elements LD are aligned, the first pixel electrode ELT1 and the second pixel electrode ELT2 may be used as driving electrodes for driving the light emitting elements LD.

The light emitting element LD may be a light emitting diode having an ultra-small size (for example, a size as small as a nano-scale to a micro-scale) using a material having an inorganic crystalline structure. For example, the light emitting element LD may include a first semiconductor layer, a second semiconductor layer, an active layer, and an insulating layer. The first semiconductor layer may include a semiconductor layer of a predetermined type, and the second semiconductor layer may include a semiconductor layer of a different type from that of the first semiconductor layer. For example, the first semiconductor layer may include an N-type semiconductor layer, and the second semiconductor layer may include a P-type semiconductor layer. The first semiconductor layer and the second semiconductor layer may include at least one semiconductor material selected from InAlGaN, GaN, AlGaN, InGaN, AlN, and InN. The active layer may be positioned between the first semiconductor layer and the second semiconductor layer, and may have a single or multiple quantum well structure. When an electric field equal to or greater than a voltage (e.g., a set or predetermined voltage) is applied to both ends of the light emitting element LD, light may be emitted while electron-hole pairs are combined in the active layer.

At least two to several tens of light emitting elements LD may be arranged and/or provided in the pixel PXL, but the number of light emitting elements LD arranged and/or provided in the pixel PXL is limited thereto. According to some embodiments, the number of light emitting elements LD arranged and/or provided in the pixel PXL may be variously changed.

The light emitting element LD may emit any one of color light and/or white light. According to some embodiments, the light emitting element LD may emit blue light in a short wavelength band, but embodiments according to the present invention are not limited thereto.

The first insulating layer INS1 may be provided and/or formed on the first and second pixel electrodes ELT1 and ELT2.

The first insulating layer INS1 may include an inorganic insulating layer made of an inorganic material or an organic insulating layer made of an organic material. The first insulating layer INS1 may be formed of an inorganic insulating layer which may enable protecting the light emitting element LD from the pixel circuit layer PCL of the pixel PXL. For example, the first insulating layer INS1 may include at least one of silicon nitride (SiNx), silicon oxide (SiOx), silicon oxynitride (SiOxNy), or a metal oxide such as aluminum oxide (AlOx), but embodiments according to the present invention are not limited thereto. According to some embodiments, the first insulating layer INS1 may be formed of an organic insulating layer to enable planarizing the supporting surfaces of the light emitting elements LD.

The first insulating layer INS1 may include a first opening OPN1 exposing one area of the first pixel electrode ELT1 and a second opening OPN2 exposing one area of the second pixel electrode ELT2. The first insulating layer INS1 may cover the remaining areas except for the one area of each of the first and second pixel electrodes ELT1 and ELT2 (that is, areas corresponding to the first and second openings OPN1 and OPN2). The light emitting elements LD may be arranged (or aligned) on the first insulating layer INS1 between the first pixel electrode ELT1 and the second pixel electrode ELT2.

The second insulating layer INS2 (or a second insulating pattern) may be provided and/or formed on the light emitting element LD. The second insulating layer INS2 may be provided and/or formed on the light emitting element LD to partially cover the outer peripheral surface (or surface) of the light emitting element LD. The active layer of the light emitting element LD may not be in contact with an external conductive material by the second insulating layer INS2. The second insulating layer INS2 may cover only a portion of the outer peripheral surface (or surface) of the light emitting element LD to expose both ends of the light emitting element LD to the outside. The second insulating layer INS2 may be formed as an independent insulating pattern in the pixel PXL, but embodiments according to the present invention are not limited thereto.

The second insulating layer INS2 may be composed of a single layer or a multilayer, and may include an inorganic insulating layer including at least one inorganic material or an organic insulating layer including at least one organic material. According to design conditions of a display device to which the light emitting element LD is applied, the second insulating layer INS2 may be composed of an inorganic insulating layer including an inorganic material or an organic insulating layer including an organic material. After the alignment of the light emitting elements LD in the pixel PXL is completed, the second insulating layer INS2 may be formed on the light emitting elements LD to prevent or reduce instances of the light emitting elements LD being separated from the aligned positions.

The first contact electrode CNE1 may be provided on the first pixel electrode ELT1 and may contact or be connected to the first pixel electrode ELT1 through the first opening OPN1 of the first insulating layer INS1. According to some embodiments, when a capping layer is arranged on the first pixel electrode ELT1, the first contact electrode CNE1 may be arranged on the capping layer and connected to the first pixel electrode ELT1 through the capping layer. The above-described capping layer may protect the first pixel electrode ELT1 from defects generated during a manufacturing process of the display device, and may further strengthen the adhesive force between the first pixel electrode ELT1 and the pixel circuit layer PCL positioned thereunder. The capping layer may include a transparent conductive material such as indium zinc oxide (IZO).

Also, the first contact electrode CNE1 may be provided and/or formed on one end of the light emitting element LD and connected to the one end of the light emitting element LD. Accordingly, the first pixel electrode ELT1 and the one end of the light emitting element LD may be electrically connected to each other through the first contact electrode CNE1.

Similar to the first contact electrode CNE1, the second contact electrode CNE2 may be provided on the second pixel electrode ELT2 and may contact or be connected to the second pixel electrode ELT2 through the second opening OPN2 of the first insulating layer INS1. According to some embodiments, when a capping layer is arranged on the second pixel electrode ELT2, the second contact electrode CNE2 may be arranged on the capping layer and connected to the second pixel electrode ELT2 through the capping layer. Also, the second contact electrode CNE2 may be provided and/or formed on the other end of the light emitting element LD and connected to the other end of the light emitting element LD. Accordingly, the second pixel electrode ELT2 and the other end of the light emitting element LD may be electrically connected to each other through the second contact electrode CNE2.

The first and second contact electrodes CNE1 and CNE2 may be composed of various transparent conductive materials so that the light emitted from the light emitting element LD and reflected by the first and second pixel electrodes ELT1 and ELT2 proceeds in the image display direction of the display device without loss. For example, the first and second contact electrodes CNE1 and CNE2 may include at least one of various transparent conductive materials such as indium tin oxide (ITO), indium zinc oxide (IZO), zinc oxide (ZnOx), indium gallium zinc oxide (IGZO), indium tin zinc oxide (ITZO), or the like, and may be configured to be substantially transparent or translucent to satisfy a light transmittance (e.g., a set or predetermined light transmittance). However, materials of the first and second contact electrodes CNE1 and CNE2 are not limited to the above-described embodiments. According to some embodiments, the first and second contact electrodes CNE1 and CNE2 may be composed of various opaque conductive materials. The first and second contact electrodes CNE1 and CNE2 may be formed of a single layer or a multilayer.

The shapes of the first and second contact electrodes CNE1 and CNE2 are not limited to a specific shape, and may be variously changed within a range in which they are electrically and stably connected to the light emitting element LD. Also, the shapes of the first and second contact electrodes CNE1 and CNE2 may be variously changed in consideration of a connection relationship with the electrodes arranged thereunder.

The first and second contact electrodes CNE1 and CNE2 may be arranged to be spaced apart from each other in the first direction DR1. For example, the first contact electrode CNE1 and the second contact electrode CNE2 may be arranged to be spaced apart from each other at a distance (e.g., a set or predetermined distance) on the second insulating layer INS2. The first contact electrode CNE1 and the second contact electrode CNE2 may be provided on the same layer and formed through the same process. However, embodiments according to the present invention are not limited thereto, and according to some embodiments, the first and second contact electrodes CNE1 and CNE2 may be provided on different layers and formed by different processes.

The third insulating layer INS3 may be provided and/or formed on the first and second contact electrodes CNE1 and CNE2. The third insulating layer INS3 may be an inorganic insulating layer including an inorganic material or an organic insulating layer including an organic material. For example, the third insulating layer INS3 may have a structure in which at least one inorganic insulating layer and at least one organic insulating layer are alternately stacked. The third insulating layer INS3 may cover the entire display element layer DPL to prevent or reduce instances of moisture, contaminants, or the like penetrating into the display element layer DPL including the light emitting elements LD from the outside.

According to some embodiments, a light conversion pattern layer may be arranged on the display element layer DPL. The light conversion pattern layer may change the wavelength (or color) of light emitted from the display element layer DPL using quantum dots, and selectively transmit light of a specific wavelength (or specific color) using a color filter. The light conversion pattern layer may be formed through a continuous process on a base surface provided by the display element layer DPL or may be formed by an adhesion process using an adhesive layer.

Figure 4:
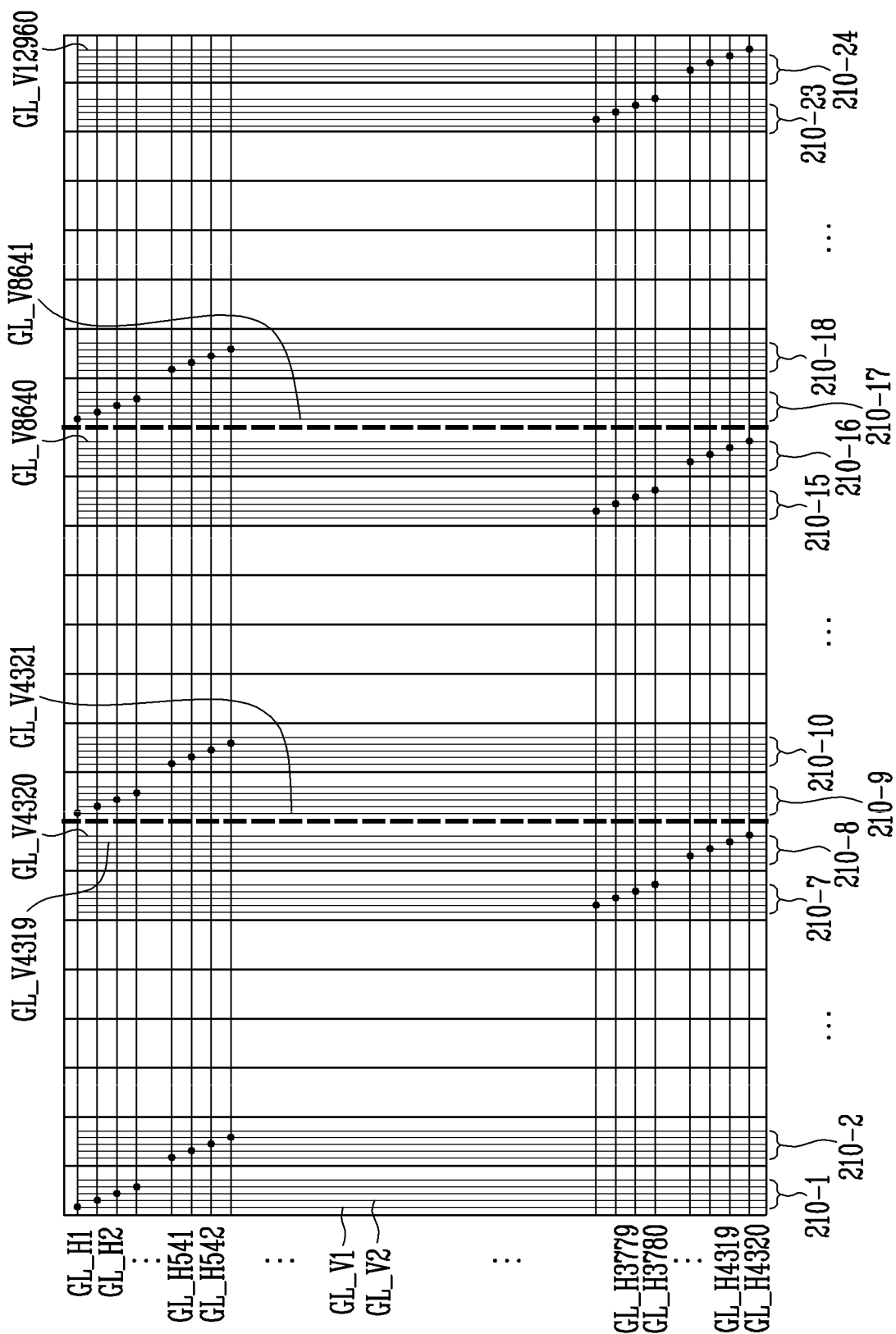
FIG. 4 is a diagram illustrating further aspects of a display panel included in the display device of FIG. 1 according to some embodiments.

FIG. 4 is a diagram illustrating further details of a display panel included in the display device of FIG. 1 according to some embodiments. FIG. 4 schematically shows the display panel 100 centered on the horizontal gate line GL_H and the vertical gate line GL_V described with reference to FIG. 1.

Referring to FIGS. 1 and 4, when the display panel 100 has a resolution of 8 k (for example, a resolution of 7920*4320), the display panel 100 may include first to 4320th horizontal gate lines GL_H1 to GL_4320. Each of the first to 4320th horizontal gate lines GL_H1 to GL_H4320 may be connected to pixels included in a corresponding pixel row.

In addition, the display panel 100 may include first to 4320th vertical gate lines GL_V1 to GL_V4320. The first to 4320th vertical gate lines GL_V1 to GL_V4320 may connect the first to 4320th horizontal gate lines GL_H1 to GL_H4320 to gate drive ICs 210-1 to 210-24.

For example, the first vertical gate line GL_V1 may connect the first horizontal gate line GL_H1 and a first gate drive IC 210-1. The second vertical gate line GL_V2 may connect the second horizontal gate line GL_H2 and the first gate drive IC 210-1. The 4319th vertical gate line GL_V4319 may connect the 4319th horizontal gate line GL_H4319 and an eighth gate drive IC 210-8. The 4320th vertical gate line GL_V4320 may connect the 4320th horizontal gate line GL_H4320 and the eighth gate drive IC 210-24.

According to some embodiments, the display panel 100 may further include 4321th to 8640th vertical gate lines GL_V4321 to GL_V8640 and 8641th to 12960th vertical gate lines GL_V8641 to GL_V12960. Similar to the first to 4320th vertical gate lines GL_V1 to GL_V4320, the 4321th to 8640th vertical gate lines GL_V4321 to GL_V8640 may connect the first to 4320th horizontal gate lines GL_H1 to GL_H4320 to ninth to sixteenth gate drive ICs 210-9 to 210-16. The 8641th to 12960th vertical gate lines GL_V8641 to GL_V12960 may connect the first to 4320th horizontal gate lines GL_H1 to GL_H4320 to seventeenth to twenty-fourth gate drive ICs 210-17 to 210-24.

That is, in order to compensate for the delay of the scan signal applied to the horizontal gate lines GL_H1 to GL_H4320, the horizontal gate lines GL_H1 to GL_H4320 may be connected to three gate drive ICs through corresponding three vertical gate lines.

When twenty-four gate drive ICs, that is, the first to twenty-fourth gate drive ICs 210-1 to 210-24 are connected to the display panel 100, each of the first to twenty-fourth gate drive ICs 210-1 to 210-24 may be connected to 540 vertical gate lines. Meanwhile, when twenty-four data drive ICs 310 (refer to FIG. 1) are provided in the display device 10 (refer to FIG. 1) to correspond to the twenty-four gate drive ICs, each data drive IC 310 may be connected to at least 640 data lines DL (refer to FIGS. 1 and 2) (for example, 7680*2 (number of sub-pixels)/24 (number of ICs)=640). In this case, in order to ensure uniformity in units of pixels, 100 (that is, 640-540) dummy lines GL_D (refer to FIGS. 1 and 2) may be arranged to correspond to each of the first to twenty-fourth gate drive ICs 210-1 to 210-24. As will be described later, the 100 dummy lines GL_D may be evenly distributed over an area covered by a corresponding gate drive IC, and all the dummy lines GL_D (for example, 24*100 dummy lines) may be evenly distributed over the entire display panel 100.

Meanwhile, as illustrated in FIG. 4, embodiments in which each of the first to twenty-fourth gate drive ICs 210-1 to 210-24 is connected to 540 vertical gate lines, one data drive IC 310 is connected to 640 data lines, and 100 dummy lines are arranged have been described as an example, but embodiments according to the present invention are not limited thereto. Depending on the resolution of the display panel 100 and the number of gate drive ICs 210, the number of vertical gate lines connected to one gate drive IC 210 and the number of corresponding dummy lines may vary. For example, one gate drive IC 210 may be connected to 270 vertical gate lines, one data drive IC 310 may be connected to 320 data lines, and 50 dummy lines may be arranged to correspond to one gate drive IC 210.

Figure 5:
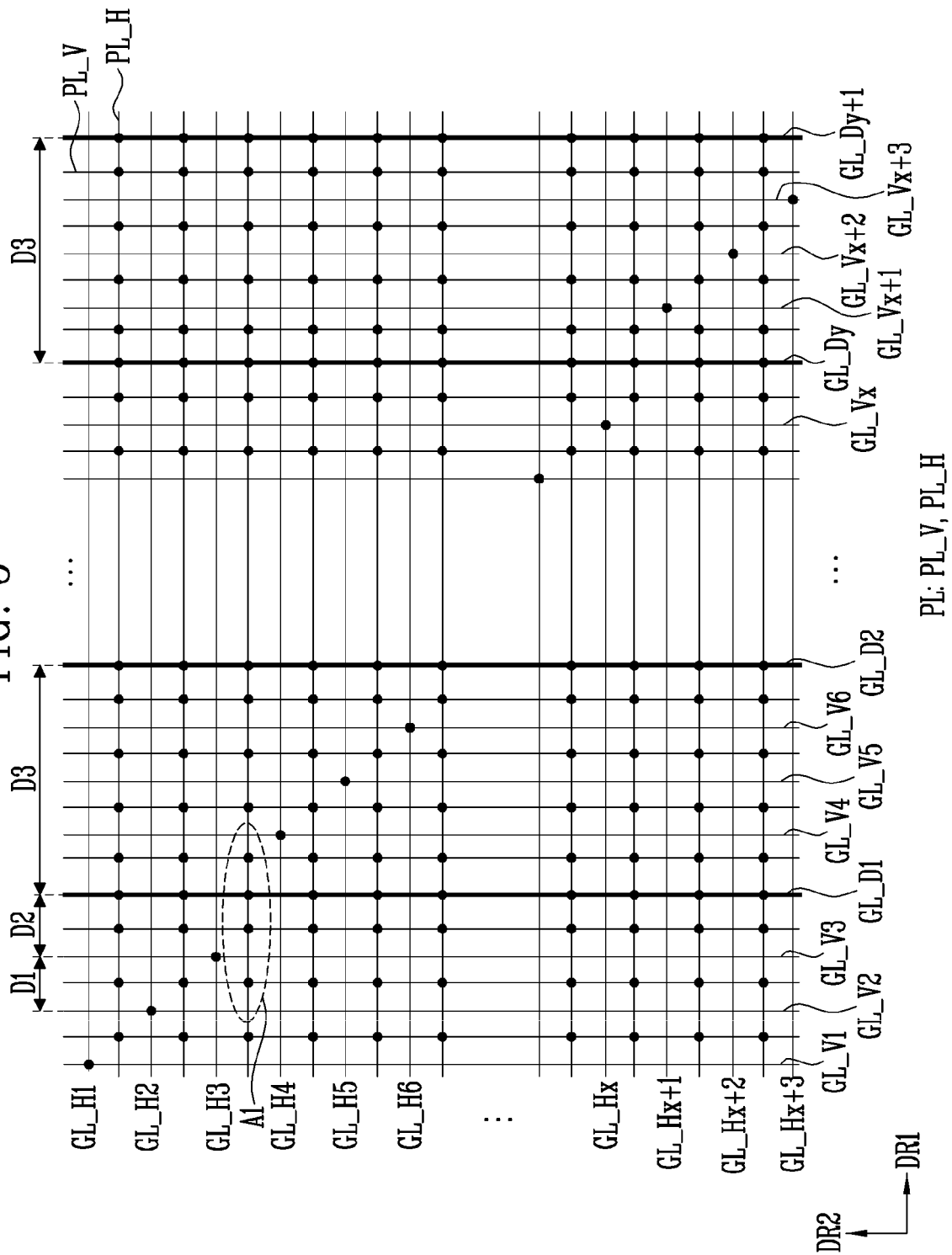
FIG. 5 is a diagram illustrating further aspects of the display panel of FIG. 4 according to some embodiments.

FIG. 5 is a diagram illustrating further details of the display panel of FIG. 4 according to some embodiments. FIG. 5 schematically shows the display panel 100 centered on the horizontal gate line GL_H, the vertical gate line GL_V, the dummy line GL_D, and the power source line PL described with reference to FIG. 1.

Referring to FIGS. 1 to 5, the power source line PL may include a horizontal power source line PL_H and a vertical power source line PL_V. The horizontal power source line PL_H may extend in the first direction DR1 and may be arranged along the second direction DR2. The vertical power source line PL_V may extend in the second direction DR2 and may be arranged along the first direction DR1. The horizontal power source line PL_H and the vertical power source line PL_V may be connected to each other in an intersecting area, and the horizontal power source line PL_H and the vertical power source line PL_V may form a mesh structure as a whole (for example, a mesh structure on a plane). In this case, the resistance of the power source line PL may be reduced, and the voltage drop in the power source line PL may be reduced.

Meanwhile, the horizontal power source line PL_H and the vertical power source line PL_V are shown to extend seamlessly in the first direction DR1 or the second direction DR2, but embodiments according to the present invention are not limited thereto. The horizontal power source line PL_H or the vertical power source line PL_V may be composed of a plurality of patterns formed on different layers.

In order to connect the power source line PL to all the pixels PXL (refer to FIG. 1) within the display panel 100 and ensure the uniformity of the pixels PXL, each of the horizontal power source line PL_H and the vertical power source line PL_V may be repeatedly arranged with a distance corresponding to one pixel PXL.

The power source line PL may be the first power source line PL1 or the second power source line PL2 described with reference to FIG. 2, or may be connected to the first power source line PL1 or the second power source line PL2. According to some embodiments, each of the first power source line PL1 and the second power source line PL2 may have the same structure (for example, the mesh structure) as the power source line PL shown in FIG. 5.

As described with reference to FIG. 4, first to (x+3)th horizontal gate lines GL_H1 to GL_Hx+3 may be connected to first to (x+3)th vertical gate lines GL_V1 to GL_Vx+3, respectively. Here, x may be an integer greater than 6. First to (y+1)th dummy lines GL_D1 to GL_Dy+1 may be dispersedly arranged between the first to (x+3)th horizontal gate lines GL_H1 to GL_Hx+3, and may be connected to the power source line PL (for example, intersecting horizontal power source line PL_H). Here, y may be an integer greater than 2. For example, at least some of the first to (y+1)th dummy lines GL_D1 to GL_Dy+1 may be connected to the first power source line PL1 (refer to FIG. 2). As another example, at least some of the first to (y+1)th dummy lines GL_D1 to GL_Dy+1 may be connected to the second power source line PL2 (refer to FIG. 2).

The first to (x+3)th horizontal gate lines GL_H1 to GL_Hx+3 may be arranged between horizontal power source lines PL_H, and the first to (x+3)th vertical gate lines GL_V1 to GL_Vx+3 and the first to (y+1)th dummy lines GL_D1 to GL_Dy+1 may be arranged between vertical power source lines PL_V.

In some embodiments, at least one vertical gate line and at least one dummy line may be alternately and repeatedly arranged along the first direction DR1. That is, at least one vertical gate line and at least one dummy line may form one group (a line group or a vertical line group), and the group may be repeatedly arranged along the first direction DR1.

As shown in FIG. 5, three vertical gate lines and one dummy line may be alternately and repeatedly arranged along the first direction DR1. For example, the first, second, and third vertical gate lines GL_V1, GL_V2, and GL_V3, the first dummy line GL_D1, the fourth, fifth, and sixth vertical gate lines GL_V4, GL_V5, and GL_V6, the second dummy line GL_D2, . . . the (x+1)th, (x+2)th, and (x+3)th vertical gate lines GL_Vx+1, GL_Vx+2, and GL_Vx+3, and the (y+1)th dummy line GL_Dy+1 may be sequentially arranged along the first direction DR1.

A distance D1 between adjacent vertical gate lines may be uniform or constant as a whole. For example, the distance D1 between the second vertical gate line GL_V2 and the third vertical gate line GL_V3 may correspond to one pixel.

In addition, a distance D2 between the vertical gate line and an adjacent dummy line may be the same as the distance D1 between the adjacent vertical gate lines. For example, the distance D2 between the third vertical gate line GL_V3 and the first dummy line GL_D1 may correspond to one pixel.

In some embodiments, a distance between the dummy lines spaced apart from each other with at least one vertical gate line interposed therebetween may be uniform or constant over the entire display panel 100. In other words, the dummy lines may not be concentrated in a specific area of the display panel 100. For example, a distance D3 between the first dummy line GL_D1 and the second dummy line GL_D2 may correspond to three pixels, and a distance D3 between the y-th dummy line GL_Dy and the (y+1)th dummy line GL_Dy+1 may also correspond to three pixels. Over the entire display panel 100, the dummy lines GL_D1, GL_D2, GL_Dy, and GL_Dy+1 may be arranged to be spaced apart from each other with the distance D3 corresponding to three pixels. By the dummy lines GL_D1, GL_D2, GL_Dy, and GL_Dy+1 that are uniformly arranged over the entire display panel 100, the voltage drop in the power source line PL may be evenly compensated or reduced over the entire display panel 100.

Meanwhile, FIG. 5 shows aspects of some embodiments in which three vertical gate lines and one dummy line are alternately and repeatedly arranged along the first direction DR1, but embodiments according to the present invention are not limited thereto. For example, when 270 vertical gate lines and 50 dummy lines correspond to one gate drive IC 210, five vertical gate lines and one dummy line may be alternately and repeatedly arranged along the first direction DR1. That is, within a range in which the dummy lines are uniformly distributed over the entire display panel 100, the number of vertical gate lines between the dummy lines and/or the number of dummy lines between the vertical gate lines (that is, the number of vertical gate lines and the number of dummy lines constituting one group) may be variously changed.

Figure 6A:
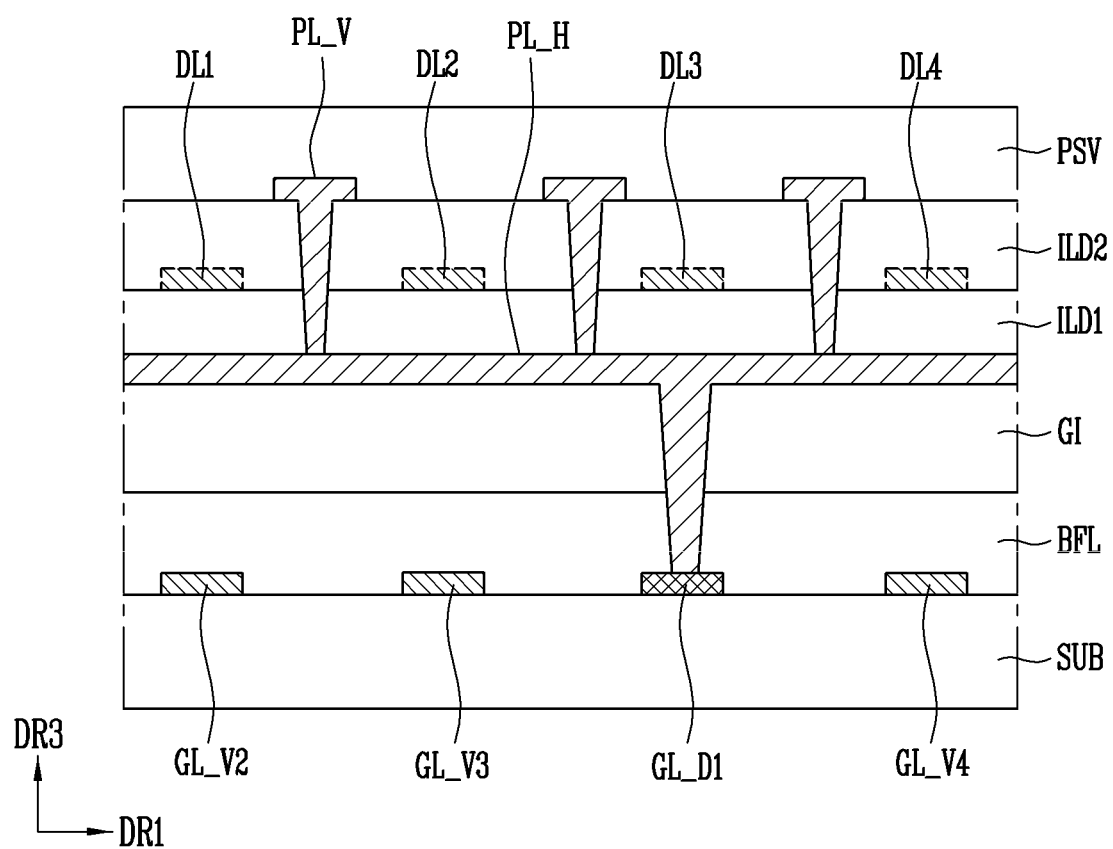
FIGS. 6A to 6D are cross-sectional views illustrating further details of an area A1 of FIG. 5 according to some embodiments.
Figure 6B:
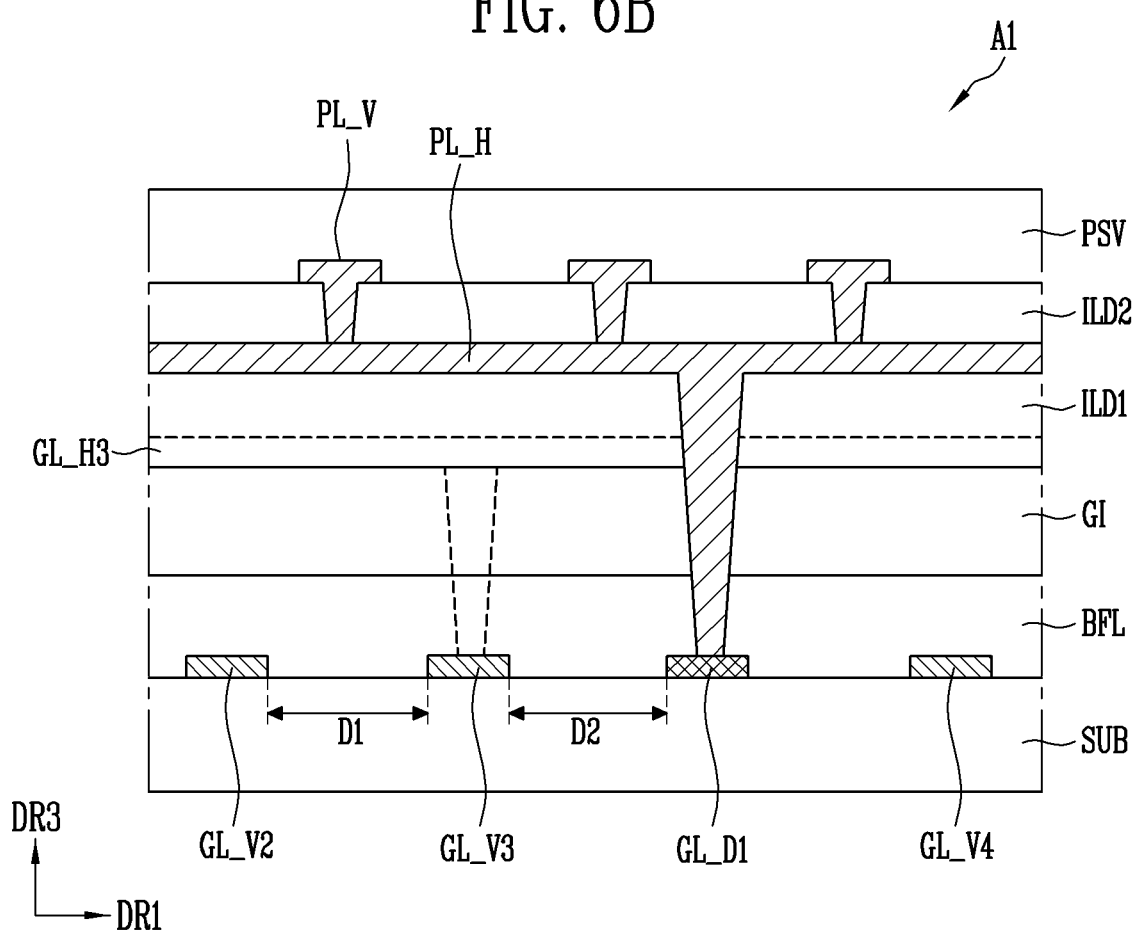
Figure 6C:
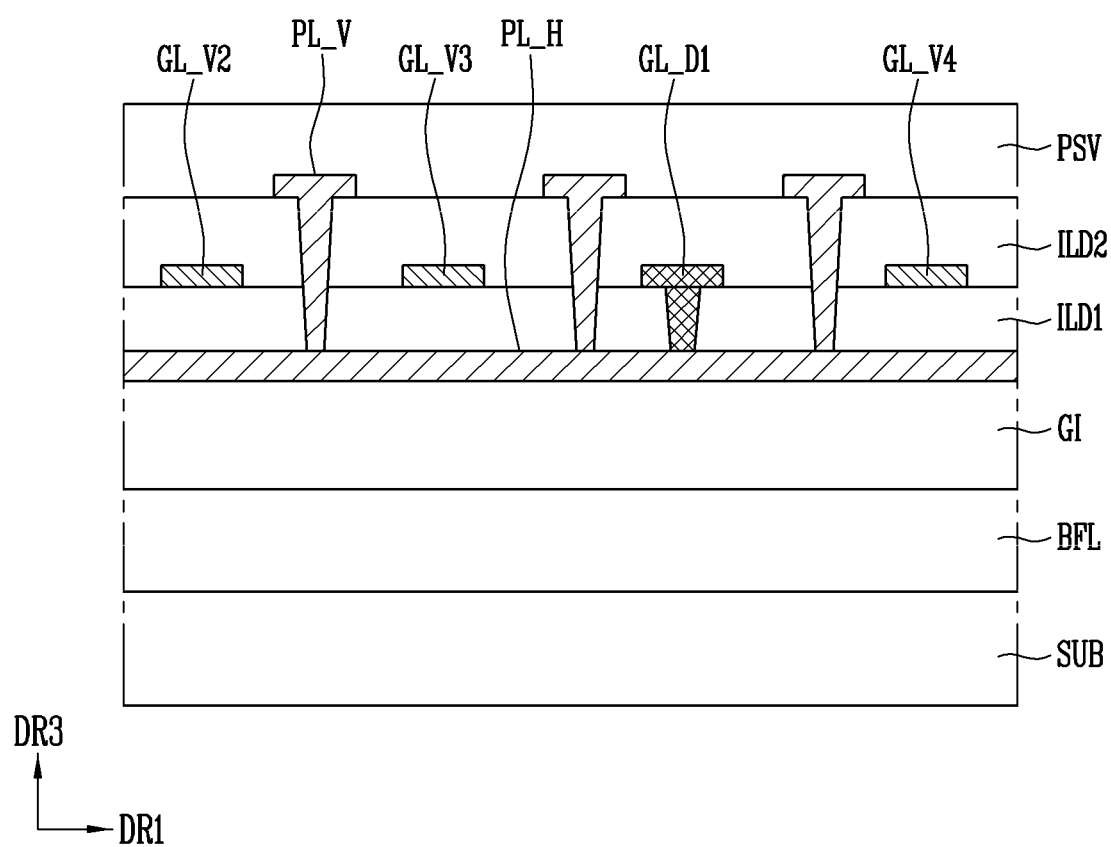
Figure 6D:
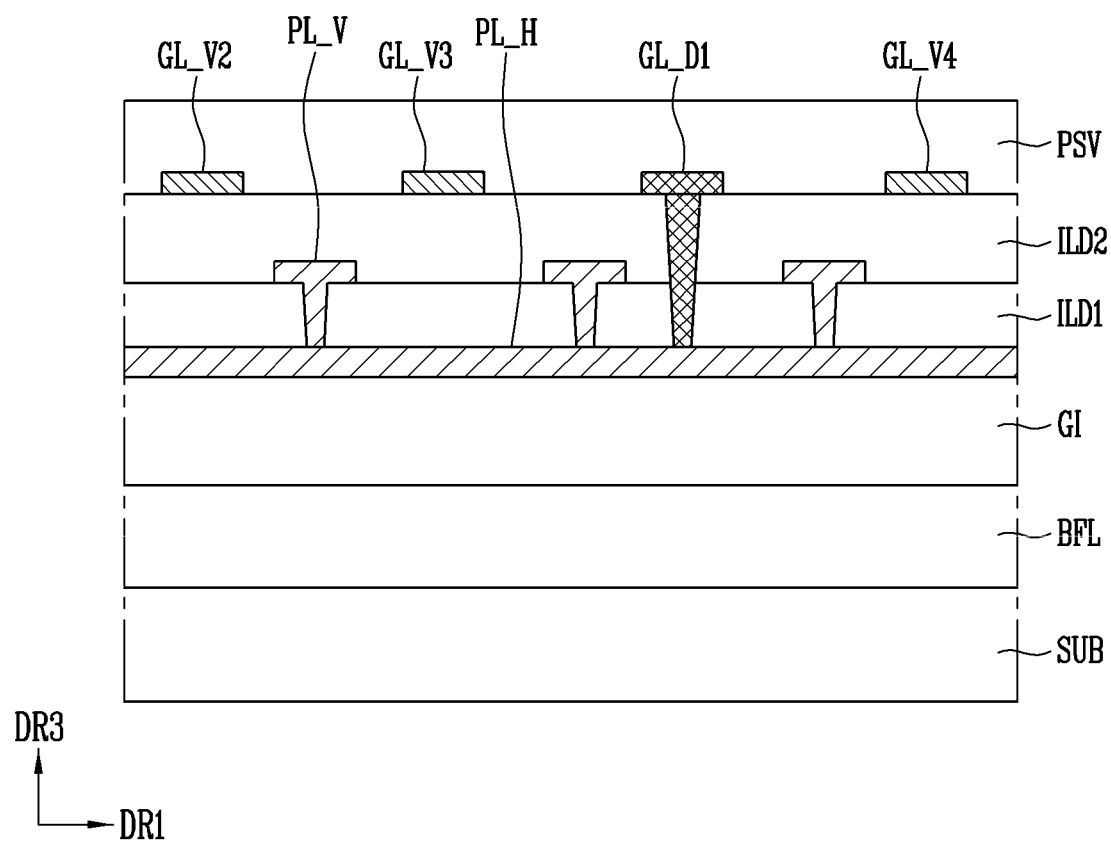

FIGS. 6A to 6D are cross-sectional views illustrating embodiments of an area A1 of FIG. 5. FIGS. 6A to 6D schematically show the display panel 100 centered on the pixel circuit layer PCL described with reference to FIG. 3. FIGS. 6A and 6B show other embodiments of a position where the horizontal power source line PL_H is arranged. FIGS. 6C and 6D show other embodiments of a position where the first dummy line GL_D1 is arranged.

First, referring to FIGS. 1 to 5 and 6A, the substrate SUB, the buffer layer BFL, the gate insulating layer GI, the first interlayer insulating layer ILD1, the second interlayer insulating layer ILD2, and the passivation layer PSV have been described with reference to FIG. 3, and thus duplicate descriptions thereof will be omitted.

The second, third, and fourth vertical gate lines GL_V2, GL_V3, and GL_V4 and the first dummy line GL_D1 may be arranged between the substrate SUB and the buffer layer BFL. The second, third, and fourth vertical gate lines GL_V2, GL_V3, and GL_V4 and the first dummy line GL_D1 may include the same material and may be simultaneously formed on the substrate SUB through the same process.

The horizontal power source line PL_H may be arranged to be spaced apart from the first dummy line GL_D1 with at least one insulating layer interposed therebetween, and may be connected to or in contact with the first dummy line GL_D1 through a contact hole penetrating the at least one insulating layer.

As shown in FIG. 6A, the horizontal power source line PL_H may be arranged on the gate insulating layer GI. The horizontal power source line PL_H may include the same material as a third horizontal gate line GL_H3 (refer to FIG. 6B) and may be formed on the gate insulating layer GI through the same process. As shown in FIG. 5, the horizontal power source line PL_H may be arranged to be spaced apart from the third horizontal gate line GL_H3 on a plane.

The horizontal power source line PL_H may be connected to or in contact with the first dummy line GL_D1 through a contact hole penetrating the buffer layer BFL and the gate insulating layer GI. The horizontal power source line PL_H may be directly connected to the first dummy line GL_D1 or connected to the first dummy line GL_D1 through a separate bridge pattern (for example, a bridge pattern arranged on the buffer layer BFL).

The third horizontal gate line GL_H3 may also be connected to or in contact with the third vertical gate line GL_V3 through a contact hole penetrating the buffer layer BFL and the gate insulating layer GI (refer to FIG. 6B).

The vertical power source line PL_V may be arranged on the second interlayer insulating layer ILD2. The vertical power source line PL_V may be connected to or in contact with the horizontal power source line PL_H through a contact hole penetrating the first and second interlayer insulating layers ILD1 and ILD2. The vertical power source line PL_V may be electrically connected to the first dummy line GL_D1 through the horizontal power source line PL_H.

That is, the first dummy line GL_D1, the horizontal power source line PL_H, and the vertical power source line PL_V may be arranged on different layers and may be connected to each other through contact holes. In this way, the first dummy line GL_D1, the horizontal power source line PL_H, and the vertical power source line PL_V may form a mesh structure on a plane.

Meanwhile, first to fourth data lines DL1 to DL4 may be arranged on the first interlayer insulating layer ILD1. The first to fourth data lines DL1 to DL4 may be the data line DL described with reference to FIG. 2. The first to fourth data lines DL1 to DL4 may be arranged to correspond to the second, third, and fourth vertical gate lines GL_V2, GL_V3, and GL_V4 and the first dummy line GL_D1, respectively.

Meanwhile, positions at which the first to fourth data lines DL1 to DL4 are arranged are not limited to those shown in FIG. 6A. For example, the first to fourth data lines DL1 to DL4 may be arranged on the second interlayer insulating layer ILD2 together with the vertical power source line PL_V.

In addition, in FIG. 6A, embodiments in which the horizontal power source line PL_H is arranged on the gate insulating layer GI has been described as an example, but embodiments according to the present invention are not limited thereto. For example, as shown in FIG. 6B, the horizontal power source line PL_H may be arranged on the first interlayer insulating layer ILD1. As another example, the horizontal power source line PL_H may be arranged on the second interlayer insulating layer ILD2 together with the vertical power source line PL_V.

In addition, in FIG. 6A, embodiments in which the vertical power source line PL_V is arranged on the second interlayer insulating layer ILD2 has been described as an example, but embodiments according to the present invention are not limited thereto. For example, the vertical power source line PL_V may be arranged on the first interlayer insulating layer ILD1, and the first to fourth data lines DL1 to DL4 may be arranged on the second interlayer insulating layer ILD2 or the first interlayer insulating layer ILD1. That is, positions at which the horizontal power source line PL_H and the vertical power source line PL_V are arranged may be variously changed within a range that does not interfere with other components (for example, the data line and the horizontal gate line).

Meanwhile, in FIGS. 6A and 6B, embodiments in which the second, third, and fourth vertical gate lines GL_V2, GL_V3, and GL_V4 and the first dummy line GL_D1 are arranged between the substrate SUB and the buffer layer BFL has been described as an example, but embodiments according to the present invention are not limited thereto. For example, as shown in FIG. 6C, the second, third, and fourth vertical gate lines GL_V2, GL_V3, and GL_V4 and the first dummy line GL_D1 may be arranged on the first interlayer insulating layer ILD1, and the first dummy line GL_D1 may be connected to or in contact with the horizontal power source line PL_H through a contact hole penetrating the first interlayer insulating layer ILD1. As another example, as shown in FIG. 6D, the second, third, and fourth vertical gate lines GL_V2, GL_V3, and GL_V4 and the first dummy line GL_D1 may be arranged on the second interlayer insulating layer ILD2, and the first dummy line GL_D1 may be connected to or in contact with the horizontal power source line PL_H through a contact hole penetrating the first and second interlayer insulating layers ILD1 and ILD2. In this case, the vertical power source line PL_V may be arranged on the first interlayer insulating layer ILD1.

As described above, the vertical lines (that is, the second, third, and fourth vertical gate lines GL_V2, GL_V3, and GL_V4, and the first dummy line GL_D1), the horizontal power source line PL_H, and the vertical power source line PL_V may be arranged at various positions within a range that does not interfere with other components (for example, the data line and the horizontal gate line).

Figure 7:
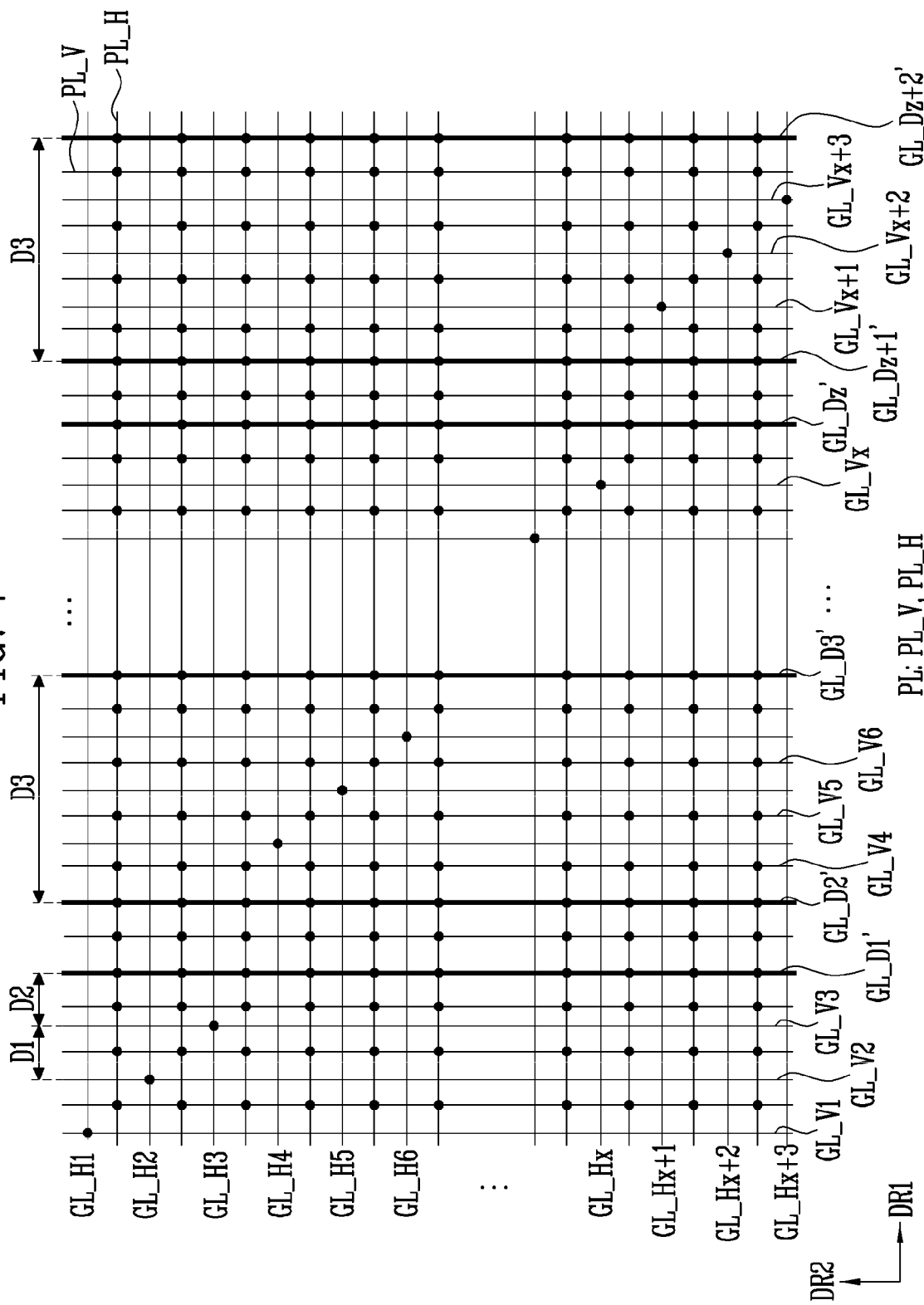
FIG. 7 is a diagram further details of the display panel of FIG. 4 according to some embodiments.

FIG. 7 is a diagram illustrating further details of the display panel of FIG. 4 according to some embodiments. FIG. 7 schematically shows the display panel 100 centered on the horizontal gate line GL_H, the vertical gate line GL_V, the dummy line GL_D, and the power source line PL described with reference to FIG. 1.

Referring to FIGS. 1 to 5 and 7, the power source line PL, the first to (x+3)th horizontal gate lines GL_H1 to GL_Hx+3, and the first to (x+3)th vertical gate lines GL_V1 to GL_Vx+3 have been described with reference to FIG. 5, and thus duplicate descriptions thereof will be omitted.

In some embodiments, a plurality of vertical gate lines and a plurality of dummy lines may be alternately and repeatedly arranged along the first direction DR1. That is, the plurality of vertical gate lines and the plurality of dummy lines may form one group (or, a line group or a vertical line group), and the group may be repeatedly arranged along the first direction DR1.

As shown in FIG. 7, three vertical gate lines and two dummy lines may be alternately and repeatedly arranged along the first direction DR1. For example, first, second, and third vertical gate lines GL_V1, GL_V2, and GL_V3, first and second dummy lines GL_D1' and GL_D2', fourth, fifth, and sixth vertical gate lines GL_V4, GL_V5, and GL_V6, a third dummy line GL_D3', z-th and (z+1)th dummy lines GL_Dz' and GL_Dz+1', (x+1)th, (x+2)th, and (x+3)th vertical gate lines GL_Vx+1, GL_Vx+2, and GL_Vx+3, and a (z+2)th dummy line GL_Dz+2' may be sequentially arranged along the first direction DR1.

In addition, a distance between a dummy line and an adjacent dummy line may be the same as a distance D2 between adjacent vertical gate lines. For example, a distance between the first dummy line GL_D1' and the second dummy line GL_D2' may correspond to one pixel.

In some embodiments, a distance between the dummy lines spaced apart from each other with the vertical gate lines interposed therebetween may be constant over the entire display panel 100. In other words, the dummy lines may not be concentrated in a specific area of the display panel 100. For example, a distance D3 between the second dummy line GL_D2' and the third dummy line GL_D3' may correspond to three pixels, and a distance D3 between the (z+1)th dummy line GL_Dz+1' and the (z+2)th dummy line GL_Dz+2' may also correspond to three pixels. Over the entire display panel 100, two dummy lines most adjacent to each other among the dummy lines GL_D1', GL_D2', GL_D3', GL_Dz', GL_Dz+1', GL_Dz+2', may form a group (or dummy line group), and the group may be repeatedly arranged along the first direction DR1 with the distance D3 corresponding to three pixels. By the dummy lines GL_D1', GL_D2', GL_D3', GL_Dz', GL_Dz+1', GL_Dz+2', . . . that are uniformly arranged over the entire display panel 100, the voltage drop in the power source line PL may be evenly compensated for over the entire display panel 100.

Meanwhile, FIG. 7 illustrates embodiments in which three vertical gate lines and two dummy lines form one group have been described as an example, but embodiments according to the present invention are not limited thereto. For example, four or more vertical gate lines and/or three or more dummy lines may be included in one group. Within a range in which the dummy lines are uniformly distributed over the entire display panel 100, the number of vertical gate lines and the number of dummy lines included in one group may be variously changed.

Figure 8:
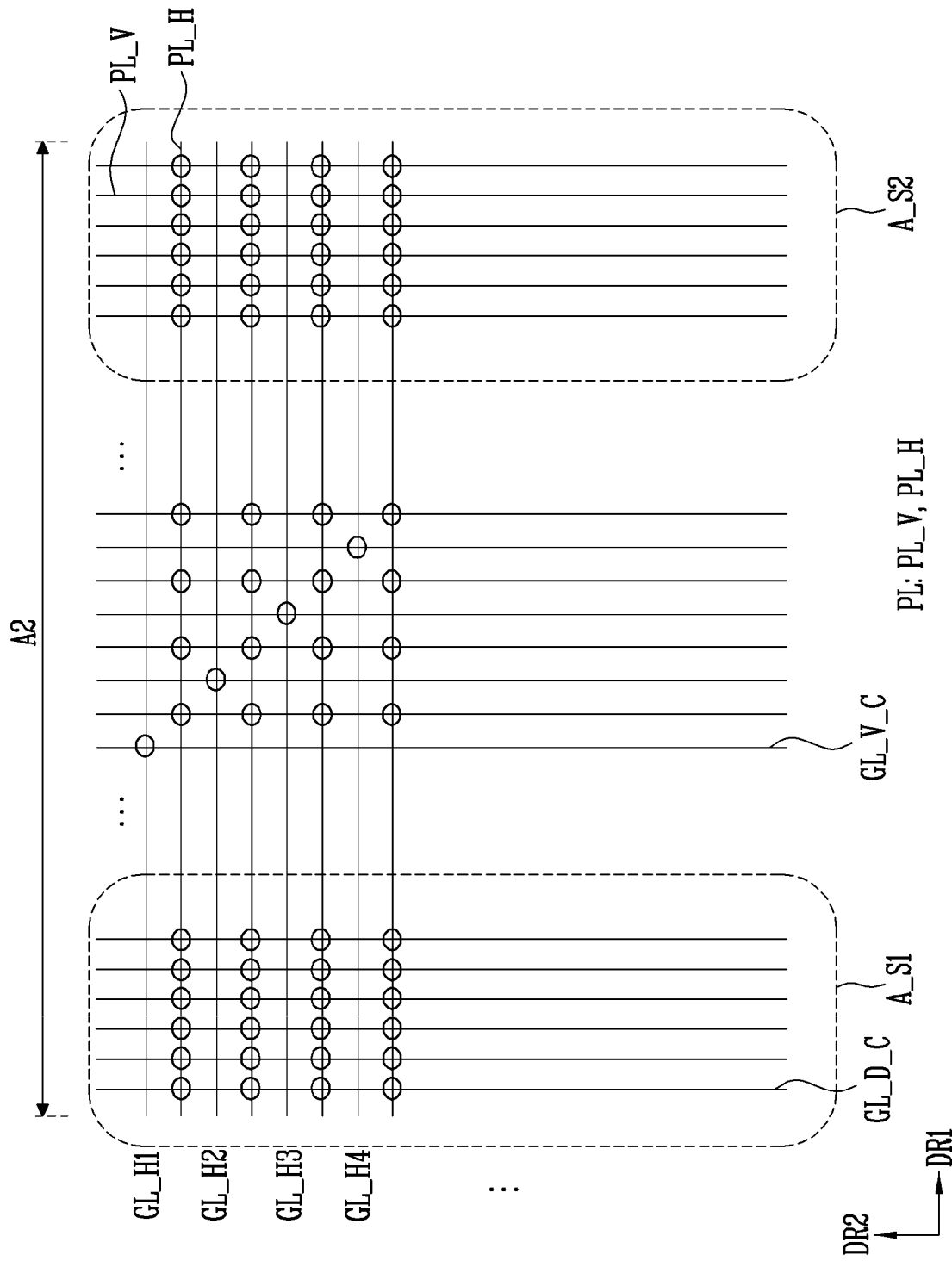
FIG. 8 is a diagram illustrating a comparison embodiment of the display panel of FIG. 4.

FIG. 8 is a diagram illustrating a comparative embodiment of the display panel of FIG. 4. FIG. 8 schematically shows the display panel 100 centered on the horizontal gate line GL_H, the vertical gate line GL_V, the dummy line GL_D, and the power source line PL described with reference to FIG. 1. A second area A2 may correspond to one gate drive IC 210 of the display panel 100 of FIG. 2.

Referring to FIGS. 5, 7, and 8, the power source line PL and the first to fourth horizontal gate lines GL_H1 to GL_H4 have been described with reference to FIG. 5, and thus duplicate descriptions thereof will be omitted.

Dummy lines GL_D_C may be arranged in an edge area of the second area A2. For example, the second area A2 may include first and second sub-areas A_S1 and A_S2 positioned in the first direction DR1 and in a direction opposite to the first direction DR1, and the dummy lines GL_D_C may be arranged only in the first and second sub-areas A_S1 and A_S2. The dummy lines GL_D_C may be connected to the power source line PL (or the horizontal power source line PL_H).

Meanwhile, vertical gate lines GL_V_C may be arranged only in the remaining area (for example, the central area) of the second area A2 except for the first and second sub-areas A_S1 and A_S2.

In this case, the voltage drop in the power source line PL may be compensated or reduced only in the first and second sub-areas A_S1 and A_S2, and the voltage drop in the power source line PL may not be relatively compensated for in the remaining area (for example, the central area) of the second area A2. With respect to the same grayscale (or the same data voltage), pixels positioned in the remaining area (for example, the center area) of the second area A2 may emit light with a relatively low luminance compared to pixels positioned in the first and second sub-areas A_S1 and A_S2 due to the voltage drop in the power source line PL. That is, a deviation in luminance may occur within the second area A2.

In order to prevent or reduce such deviation in luminance, the display panel 100 (refer to FIGS. 5 and 7) according to the embodiments of the present invention may include the dummy lines uniformly arranged over the entire display panel 100.

Figure 9:
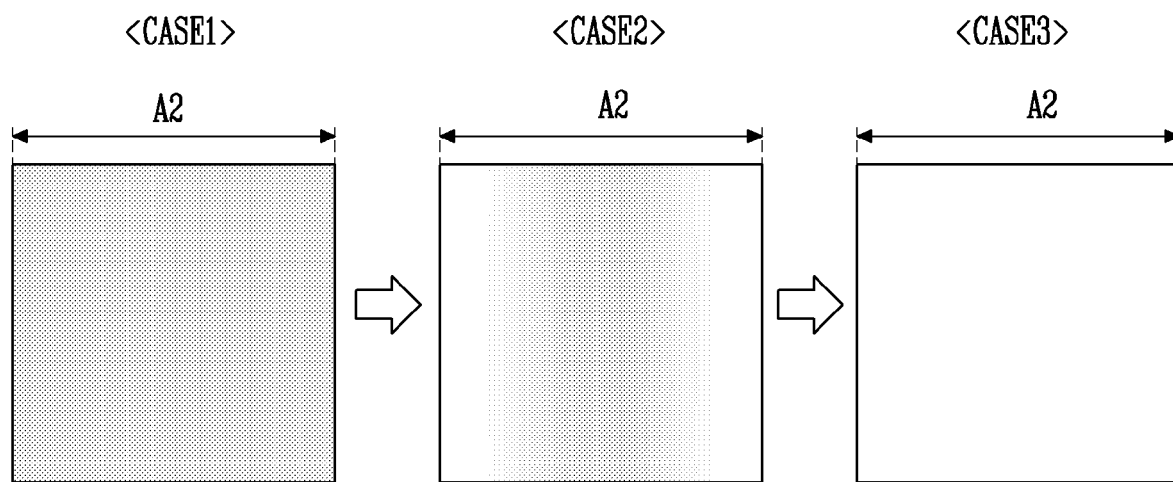
FIG. 9 is a diagram illustrating an image displayed on the display device of FIG. 1 according to some embodiments.

FIG. 9 is a diagram illustrating embodiments of an image displayed on the display device of FIG. 1.

Referring to FIGS. 1 to 9, in a first case, a full white image (for example, an image corresponding to the maximum grayscale) displayed on the display panel 100 (or the second area A2 of the display panel 100, refer to FIG. 9) when the dummy line GL_D (refer to FIG. 1) is not connected to the power source line PL is represented.

In a second case, a full white image displayed on the display panel 100 according to the comparative embodiment of FIG. 8 is represented. As described with reference to FIG. 8, because the voltage drop in the power source line PL is compensated only in the first and second sub-areas A_S1 and A_S2, the luminance of the image corresponding the first and second sub-areas A_S1 and A_S2 may appear higher than the luminance corresponding to the remaining area (for example, the central area) of the second area A2.

In a third case, a full white image displayed on the display panel 100 according to the embodiments of FIGS. 5 and 7 is represented. As described with reference to FIGS. 5 and 7, because the dummy lines GL_D are uniformly arranged over the entire display panel 100, the voltage drop in the power source line PL may be compensated or reduced over the entire display panel 100, and overall luminance may be improved in the second area A2.

The display device according to some embodiments of the present invention may include gate connection lines (or vertical gate lines) connecting the gate driver arranged at one side of the display panel to gate lines (or horizontal gate lines) and dummy lines arranged between the gate connection lines, and the dummy lines may be connected to the power source line. Accordingly, the voltage drop in the power source line can be reduced by the dummy lines.

In addition, the dummy lines may be uniformly arranged over the entire display panel. Accordingly, the voltage drop in the power source line may be reduced evenly over the entire display panel, and the deviation in luminance across the entire display panel may be improved.

The effects according to the embodiments of the present invention are not limited by the contents described above, and more various effects are included in the disclosure.

Aspects of some embodiments of the present invention have been described above with reference to the accompanying drawings. However, those skilled in the art or those of ordinary skill in the art to which the present invention pertains will appreciate that various modifications and changes can be made to the described embodiments without departing from the spirit and technical scope of embodiments according to the present invention described in the following claims and their equivalents.

Therefore, the technical protection scope of embodiments according to the present invention are not limited to the content described in the detailed description of the specification, but should be defined by the appended claims, and their equivalents.

What is claimed is:

1. A display device comprising:
    a power source line;
    a plurality of gate lines each extending in a first direction and arranged along a second direction in a plan view;
    a plurality of pixels connected to the power source line and the gate lines; and
    a plurality of vertical lines each extending in the second direction and arranged along the first direction in the plan view,
    wherein the vertical lines include a plurality of gate connection lines and a plurality of dummy lines between the gate connection lines,
    wherein the gate connection lines connect the gate lines to a gate driver,
    wherein the dummy lines are connected to the power source line, and
    wherein a distance between the dummy lines spaced apart from each other with at least one of the gate connection lines interposed therebetween is constant throughout.

2. The display device of claim 1, wherein the power source line includes a first power source line to which a first power source voltage is applied, and a second power source line to which a second power source voltage lower than the first power source voltage is applied, and
    wherein each of the pixels includes at least one light emitting element electrically connected between the first power source line and the second power source line.

3. The display device of claim 2, wherein the dummy lines are electrically connected to the first power source line.

4. The display device of claim 2, wherein the dummy lines are electrically connected to the second power source line.

5. The display device of claim 1, wherein the vertical lines are arranged along the first direction and are spaced apart from each other by a distance corresponding to one of the pixels.

6. The display device of claim 1, wherein at least one gate connection line among the gate connection lines and at least one dummy line among the dummy lines form a line group, and
    wherein the line group is repeatedly arranged along the first direction.

7. The display device of claim 6, wherein the line group includes at least two dummy lines among the dummy lines.

8. The display device of claim 1, wherein the power source line includes horizontal power source lines extending in the first direction and spaced apart from each other along the second direction,
    wherein the dummy lines are connected to the horizontal power source lines, and
    wherein the dummy lines and the horizontal power source lines form a mesh structure in the plan view.

9. The display device of claim 8, wherein the gate connection lines and the dummy lines are on a same layer and include a same material.

10. The display device of claim 9, wherein the dummy lines are spaced apart from the horizontal power source lines with at least one insulating layer interposed therebetween, and
    wherein the horizontal power source lines are connected to the dummy lines through contact holes penetrating the at least one insulating layer.

11. The display device of claim 9, wherein the horizontal power source lines and the gate lines are on a same layer and include a same material.

12. The display device of claim 9, wherein each of the pixels includes a transistor on a substrate and at least one light emitting element connected to the transistor, and wherein the dummy lines are between the substrate and the transistor.

13. The display device of claim 12, wherein the horizontal power source lines are on a same layer as one of a gate electrode, a source electrode, and a drain electrode of the transistor.

14. The display device of claim 1, further comprising:
a plurality of data lines each extending in the second direction and arranged in the first direction in the plan view, and connected to the pixels;
the gate driver connected to the gate lines; and
a data driver connected to the data lines,
wherein the gate driver and the data driver are positioned in a same direction based on the pixels in the plan view.

15. A display device comprising:
a plurality of pixels in a display area;
a power source line in the display area and connected to the pixels;
a plurality of gate lines each extending in a first direction and arranged along a second direction in a plan view, and connected to the pixels;
a plurality of gate connection lines each extending in the second direction and arranged along the first direction in the plan view, and connected to the gate lines; and
a plurality of dummy lines on a same layer as the gate connection lines, each extending in the second direction in the plan view, and connected to the power source line within the display area,
wherein at least one gate connection line among the gate connection lines and at least one dummy line among the dummy lines form a line group, and
wherein the line group is repeatedly arranged along the second first direction over an entire display area.

16. The display device of claim 15, wherein a distance between the dummy lines spaced apart from each other with the at least one gate connection line among the gate connection lines interposed therebetween is constant over the entire display area.

17. The display device of claim 15, wherein the power source line includes a first power source line to which a first power source voltage is applied and a second power source line to which a second power source voltage lower than the first power source voltage is applied, and
wherein each of the pixels includes at least one light emitting element electrically connected between the first power source line and the second power source line.

18. The display device of claim 17, wherein at least some of the dummy lines are electrically connected to the first power source line.

19. The display device of claim 17, wherein at least some of the dummy lines are electrically connected to the second power source line.

20. The display device of claim 15, wherein the power source line includes horizontal power source lines extending in the first direction and spaced apart from each other along the second direction,
wherein the dummy lines are connected to the horizontal power source lines, and wherein the dummy lines and the horizontal power source lines form a mesh structure in the plan view.

* * * * *